United States Patent
Isomura et al.

[11] Patent Number: 6,069,475
[45] Date of Patent: May 30, 2000

[54] MAGNETIC SENSOR UTILIZING IMPEDANCE VARIATION OF A SOFT MAGNETIC ELEMENT IN DEPENDENCE UPON A MAGNETIC FIELD STRENGTH AND A METHOD OF MANUFACTURING THE SAME

[75] Inventors: Akihiro Isomura, Sendai; Ken-Ichi Arai, 28-9, Yamanotera 2-chome, Izumi-ku, Sendai-shi, Miyagi, both of Japan

[73] Assignees: Tokin Corporation; Ken-Ichi Arai, both of Miyagi, Japan

[21] Appl. No.: 08/929,558

[22] Filed: Sep. 15, 1997

[30] Foreign Application Priority Data

| Sep. 17, 1996 | [JP] | Japan | 8-244860 |
| Sep. 17, 1996 | [JP] | Japan | 8-245071 |
| Sep. 18, 1996 | [JP] | Japan | 8-246727 |

[51] Int. Cl.[7] .......... G01R 33/02; G01B 5/127; G01B 5/33
[52] U.S. Cl. .......... 324/244; 324/249; 324/260; 360/110
[58] Field of Search .......... 324/244, 249, 324/250, 252, 260; 360/110

[56] References Cited

U.S. PATENT DOCUMENTS

| 4,635,152 | 1/1987 | Iwasaki et al. | 360/110 |
| 5,365,391 | 11/1994 | Sugiyama et al. | 324/250 X |
| 5,811,971 | 9/1998 | Senda et al. | 324/260 X |
| 5,838,154 | 11/1998 | Morikawa et al. | 324/260 X |

FOREIGN PATENT DOCUMENTS

| 0501478 A2 | 9/1992 | European Pat. Off. |
| 0640840 A2 | 3/1995 | European Pat. Off. |
| 6-176930 | 6/1994 | Japan . |
| 7-248365 | 9/1995 | Japan . |

OTHER PUBLICATIONS

Masakatsu Senda et al : "Micro–Magnetic Devices Using Magnetic Multilayer Films" NTT Review, vol. 7, No. 6, Nov. 1, 1995, pp. 89–95.

Hika K. et al : "Magneto–Impedance in Sandwich Film for Magnetic Sensor Heads" IEEE Transactions on Magnetics, vol. 32, No. 5, Sep. 1996, pp. 4594–4596.

Sensors and Micromachines–Key Components in Future Systems, Ingemar Lundstrom, The Transactions of the Institute of Electrical Engineers of Japan, IEEE, vol. 116–E, No. 1, 1996, article entitled "Micro Magnetic Sensors" by K. Mohri, pp. 7–10.

Article entitled "Colpitts–Oscillator–Type Micro–Magnetic Sensor Using Amorphous MI Elements", by T. Uchiyama et al., Journal of the Magnetics Society of Japan, vol. 19, No. 2, 1995, pp. 469–472 and Table of Contents (all in English and Japanese).

(List continued on next page.)

*Primary Examiner*—Gerard Strecker
*Attorney, Agent, or Firm*—Frishauf, Holtz, Goodman, Langer & Chick, P.C.

[57] ABSTRACT

A magnetic sensor (31) includes an insulator substrate (37) having first and second surfaces opposite to each other, a soft magnetic element having first and second ends opposite to each other and mounted on the first surface of the insulator substrate, and a conductor mounted on the second surface of the insulator substrate, and an output port coupled to the first and the second ends of the soft magnetic element for deriving an impedance of the soft magnetic element between the first and the second ends. The impedance changes in dependence upon a magnetic field strength applied to the soft magnetic element. In the magnetic sensor (31), the soft magnetic element is a soft magnetic wire (33). The conductor is a ground conductor (35) to be grounded. The magnetic sensor may further comprise a short-circuiting conductor (39) connecting the first end of the soft magnetic wire with the ground conductor while the output port is coupled to the short-circuiting conductor and the second end of the soft magnetic wire. The soft magnetic element may comprise a soft magnetic thin film.

9 Claims, 19 Drawing Sheets

OTHER PUBLICATIONS

Article entitled "Magneto–Impedance (MI) Effects in Sputtered Amorphous Film and Magnetic Sensors", by T. Uchiyama et al, The Transactions of The Institute of Electrical Engineers of Japan, vol. 115–A, No. 10, 1995, pp. 949–955 (with English Abstract).

Article entitled "A Study on Thin–Film Magnetic Head Using Impedance Change", by M. Senda et al, IEEE Magnetics Society Tokyo Chapter, MAG 95–116—130, Aug. 29, 1995, pp. 91–100.

Article entitled "Thin–Film GMI Elements With High Sensitivity" by T. Morikawa et al, Journal of the Magnetics Society of Japan, vol. 20, No. 2, 1996, pp. 553–556 (with English Abstract) and Table of Contents (in English and in Japanese).

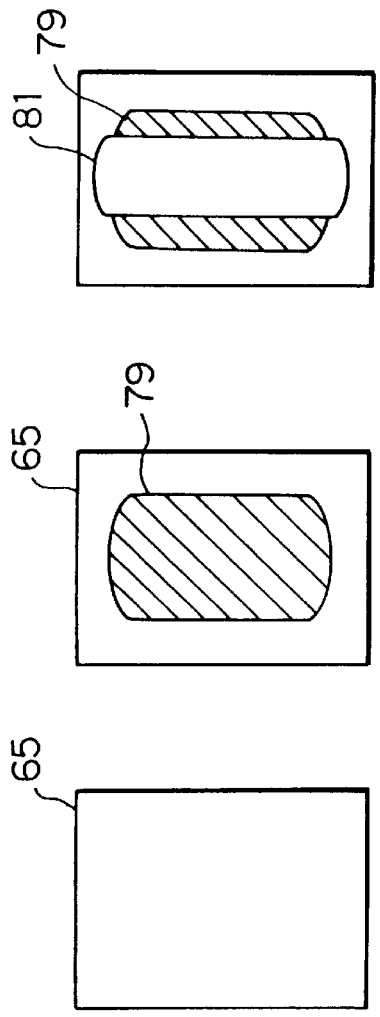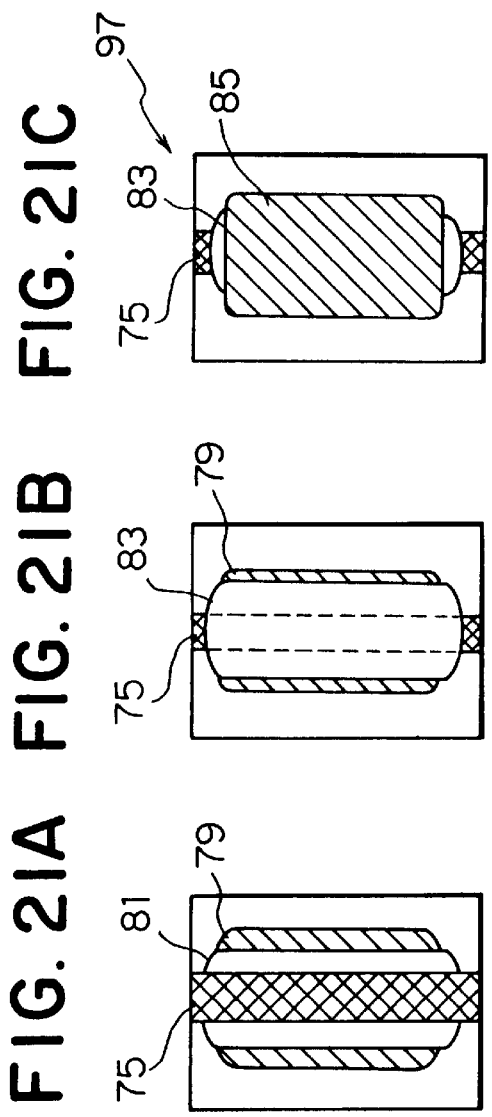
FIG. 21A  FIG. 21B  FIG. 21C
FIG. 21D  FIG. 21E  FIG. 21F

MAGNETIC SENSOR UTILIZING IMPEDANCE VARIATION OF A SOFT MAGNETIC ELEMENT IN DEPENDENCE UPON A MAGNETIC FIELD STRENGTH AND A METHOD OF MANUFACTURING THE SAME

BACKGROUND OF THE INVENTION

This invention relates to a magnetic sensor exhibiting variation of an impedance in dependence upon the strength of an external magnetic field and, in particular, to a magnetic sensor for use as a magnetic head and the like.

In recent years, rapid progress has been made in the development of small-sized and high-performance electronic apparatuses. As a reading head for small-sized and large-capacity hard disks in computer-associated apparatuses, a conventional magnetic head utilizing electromagnetic induction is being replaced by a magnetoresistive head (MR head) utilizing a magnetoresistance effect. However, even the MR head is insufficient to meet further increases in recording density. Under the circumstances, there is a strong demand for a new magnetic element exhibiting wide variation in electric characteristics in response to variation in strength of an external magnetic field.

Besides, the MR head is insufficient for use in measurement and detection of a weak magnetic field, such as measurement of geomagnetic strength or the magnetic field of a brain.

In view of the above, proposal has been made of a magnetic sensor (also referred to as a "magnetic impedance element") comprising a soft magnetic wire to be supplied with a high-frequency current. In response to the variation in strength of the external magnetic field, the soft magnetic wire exhibits a variation in resistance and inductance, namely, a variation in impedance. Thus, the impedance variation is utilized in detection of magnetic field strength (Japanese Unexamined Patent Publications Nos. 176930/1994 and 248365/1995, Proc. of The Institute of Electrical Engineers of Japan, Vol. E116, No. 1, page 7 (1996)). Such magnetic sensor exhibits wide variation in impedance in response to the variation in strength of the external magnetic field and therefore has a good performance for a magnetic head.

However, the impedance variation rate (i.e., magnetic field sensitivity) in dependence upon the variation in magnetic field strength is as small as 10%/Oe.

In order to remove the above-mentioned disadvantage, proposal has been made of another magnetic sensor comprising an oscillation circuit formed by a combination of a transistor and a soft magnetic wire. With this structure, LC resonance is utilized to improve sensitivity (Journal of The Magnetics Society of Japan, Vol. 19, page 469 (1995)). However, this magnetic sensor not only requires active components but also a plurality of resistors, capacitors, and diodes. Therefore, the production cost inevitably becomes high.

On the other hand, consideration is made about the use of a single layer of an amorphous metal magnetic film in order to realize a small-sized magnetic sensor (Proc. of The Institute of Electrical Engineers of Japan, 115-A, page 949 (1995)). In this magnetic sensor, an electric current is directly supplied to the magnetic film so as to detect impedance variation in dependence upon the external magnetic field. However, as compared with those metals, such as Cu, Al, and Ag, generally used as a conductor line, the amorphous metal magnetic film has a large electrical resistance. Accordingly, efficient excitation can not be carried out and the impedance variation rate is small.

Furthermore, proposal has been made of a yet another magnetic sensor or magnetic impedance element comprising a sputtered permalloy film of a stripe pattern including a Cu film (Senda et al, The Institute of Electrical Engineers, Technical Meeting on Magnetics, MAG-95-126, 91 (1995)). In addition, proposal has been made of a different magnetic sensor comprising CoSiB films with uniaxial magnetic anisotropy introduced and a Cu conductor layer interposed therebetween (Morikawa et al, Journal of The Magnetics Society of Japan, No. 20, page 553 (1996)). These magnetic sensors exhibit an impedance variation rate between −50 and +120% with respect to the external magnetic field varying within a certain range. However, magnetic field sensitivity is no more than −5 to +10%/Oe. In addition, it is difficult to control the magnetic anisotropy.

In the meanwhile, in the above-mentioned magnetic sensors using soft magnetic elements, the impedance of the magnetic sensor is increased in a frequency band on the order of several ten to several hundred megahertz (MHz) under the influence of the skin effect and the increase in eddy current loss. This means that the impedance variation in response to the variation in strength of the external magnetic field is relatively small.

In the above-mentioned conventional magnetic sensors, stray capacitance is produced between the magnetic sensor and other circuit components or conductor lines present around the magnetic sensor. This results in unstable operation of the magnetic sensor.

SUMMARY OF THE INVENTION

It is a first object of this invention to provide a magnetic sensor which is hardly disturbed by conductors and dielectrics existing around the magnetic sensor which is therefore stably operable.

It is a second object of this invention to provide a magnetic sensor which is high in magnetic field sensitivity, simple in manufacture, and low in cost.

It is a third object of this invention to provide a magnetic sensor which is not only excellent in magnetic field sensitivity but which also exhibits wide impedance variation in response to a variation in strength of an external magnetic field so that stable operation is assured.

It is a fourth object of this invention to provide a magnetic sensor which is capable of decreasing a d.c. electric resistance so that a higher sensitivity is achieved as compared with that comprising a magnetic metal layer or wire to be used also as a conductor metal.

It is a fifth object of this invention to provide a magnetic sensor which is capable of suppressing eddy current loss so as to improve magnetic characteristics in a high-frequency band.

It is a sixth object of this invention to provide a magnetic sensor having a large impedance variation rate.

It is a seventh object of this invention to provide a method of manufacturing each of magnetic sensors of the types described above.

According to this invention, there is provided a magnetic sensor for detecting a magnetic field strength, comprising an insulator substrate having first and second surfaces opposite to each other; a soft magnetic element having first and second ends opposite to each other and mounted on the first surface of the insulator substrate; a conductor mounted on the second surface of the insulator substrate; and an output port coupled to the first and the second ends of the soft magnetic element for deriving an impedance of the soft magnetic element between the first and the second ends, the impedance changing in dependence upon a magnetic field strength applied to the soft magnetic element.

According to this invention, there is also provided a magnetic sensor comprising an insulator substrate and a soft magnetic thin film element formed on the substrate, which further comprises an inner conductor layer surrounded by the soft magnetic thin film element through an inner insulator layer. The soft magnetic thin film element comprises a Co—Nb—Zr thin layer essentially consisting of 80–87 atomic percent Co, 10–17 atomic percent Nb, and 1–6 atomic percent Zr.

According to this invention, there is also provided a method of manufacturing a magnetic sensor comprising the steps of forming a first soft magnetic film on an insulator substrate; forming a first insulator film on the first soft magnetic film; forming a conductor layer on the first insulator film; forming a second insulator film to cover the conductor layer except both ends thereof; and forming a second soft magnetic film to cover the second insulator film so as to form a closed magnetic loop comprising the first and the second soft magnetic films. Each of the first and the second soft magnetic films comprises a Co—Nb—Zr thin film essentially consisting of 80–87 atomic percent Co, 10–17 atomic percent Nb, and 1–6 atomic percent Zr.

Herein, description will be made about the reason why the above-specified composition is selected. In the composition of the Co—Nb—Zr thin film, inclusion of more than 87 atomic percent of Co favorably increases saturation magnetization but unfavorably increase magnetostriction which results in deterioration of soft magnetic characteristics. Therefore, the impedance variation rate in response to the variation in strength of the external magnetic field is reduced. In addition, an amorphous film is difficult to obtain. On the other hand, less than 80 atomic percent of Co decreases saturation magnetization so that the impedance variation rate in dependence upon the variation in strength of the external magnetic field becomes small.

Zr has a function of transforming the Co—Nb—Zr film into an amorphous film and the content of 1 atomic percent or more is required. The content of more than 6 atomic percent is unfavorable because magnetostriction is increased to result in deterioration of soft magnetic characteristics.

As regards Nb, the content of 10–16 atomic percent is most preferable because zero magnetostriction is achieved. Less than 10 atomic percent increases positive magnetostriction to cause deterioration of soft magnetic characteristics, i.e., deterioration of the impedance variation rate. On the other hand, more than 16 atomic percent is unfavorable because saturation magnetization is degraded.

Thus, since the thin film technique is used in this invention, fine process is easy to perform. Like other thin film magnetic sensors, the magnetic sensor of this invention is excellent in this respect as compared with those using a wire material.

According to this invention, the conductor layer and the magnetic layer are electrically insulated from each other so as to decrease the eddy current loss. Therefore, characteristics in high-frequency band are excellent.

BRIEF DESCRIPTION OF THE DRAWING

FIGS. 21A, 21B, 21C, 21D, 21E, and 21F are views for describing a manufacturing process of the magnetic sensor illustrated in FIG. 18;

DESCRIPTION OF THE PREFERRED EMBODIMENTS

Prior to description of preferred embodiments of this invention, a conventional magnetic sensor will hereafter be described for a better understanding of this invention.

Figure 1A:
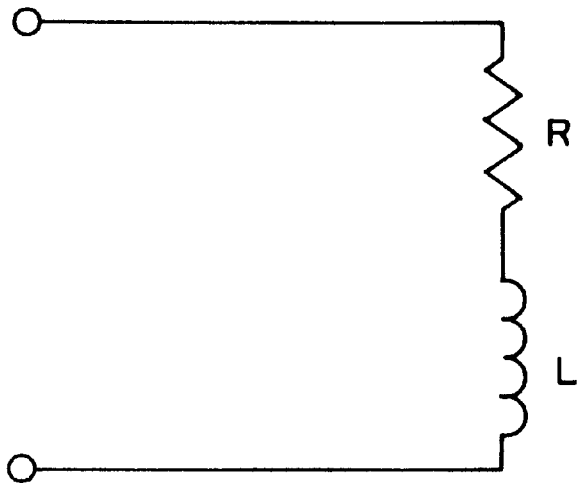
FIGS. 1A and 1B show equivalent circuits of a conventional magnetic sensor without any stray capacitance and with stray capacitance, respectively.

Referring to FIG. 1A, the conventional magnetic sensor using a soft magnetic element such as wire is represented by an equivalent circuit having two terminals. The magnetic sensor detects the change in strength of a magnetic field as the variation in impedance of the soft magnetic wire. The impedance is represented by Z=R+jωL (ω being an angular frequency of an a.c. current supplied to the soft magnetic wire). Specifically, values of the resistance R and the inductance L vary in dependence upon an external magnetic field. Detailed description will be given below.

When the soft magnetic wire is supplied with a high-frequency current, a magnetic field is formed to circle the soft magnetic element. When the external magnetic field Hex applied to the soft magnetic wire is equal to zero, the soft magnetic wire is excited along an easy magnetization axis and a magnetization process by movement of a domain wall is carried out. Accordingly, when a supply current has a frequency (f) in a frequency band of several megahertz (MHz) or more, relative permeability is substantially equal to 1 and the inductance L has a small value determined by a conductor itself. On the other hand, when the external magnetic field Hex is applied, magnetization is inclined from an excitation direction and a magnetization process by rotation of magnetization is carried out. Accordingly, the relative permeability of the soft magnetic wire is increased and has a maximum value at Hex=Hk (Hk being an anisotropic magnetic field). In addition, at Hex>Hk, magnetization is fixed in a direction of the external magnetic field Hex, the relative permeability is reduced again. Therefore, the inductance L is changed in dependence upon the strength of the external magnetic field Hex and has a maximum value around Hex=Hk.

On the other hand, the resistance R is substantially determined by a d.c. resistance of the conductor when the supply current has a frequency f in a frequency band of several megahertz (MHz). However, in a frequency band on the order of 10 MHz or more, the resistance R is increased under the influence of the eddy current loss and the skin effect. The skin effect is determined by a skin depth δ given by Equation (1):

$$\delta = \sqrt{\rho/(\pi f \mu)}, \quad (1)$$

where ρ, f, and μ represents resistivity, frequency, and permeability, respectively. As will be understood from Equation (1), at such a high frequency f that the skin effect is not negligible with respect to a film thickness, the skin depth is reduced and the electric resistance is increased when the permeability μ is increased in dependence upon the external magnetic field Hex. Therefore, in a high frequency range requiring consideration about the skin depth δ, the electric resistance also changes in correspondence to the external magnetic field Hex.

In the above-mentioned magnetic sensor, the relative permeability is substantially equal to 1 in a frequency band on the order of several megahertz (MHz). Therefore, the change in inductance L in correspondence to the external magnetic field is small. However, by utilizing the feature that the relative permeability has a maximum value when the external magnetic field is equal in strength to the anisotropic magnetic field, the variation in impedance in dependence upon the variation in strength of the external magnetic field can be increased.

Thus, the magnetic sensor using the soft magnetic element can detect the variation in strength of the external magnetic field as the variation in impedance.

Figure 1B:
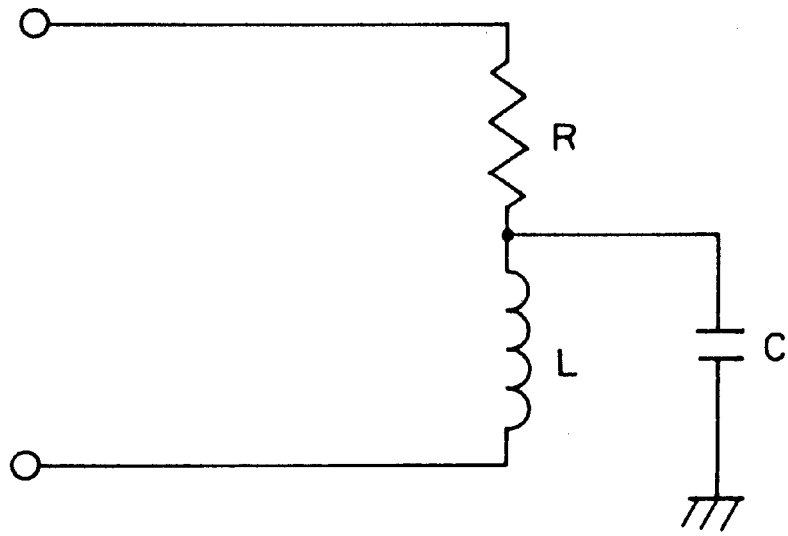

Referring to FIG. 1B, in the conventional magnetic sensor, stray capacitance C is produced between the sensor element and other circuit components and conductor lines therearound. The stray capacitance C constitutes a factor of unstable operation.

Now, description will proceed to preferred embodiments of this invention with reference to the drawing.

First Embodiment

Figure 2:
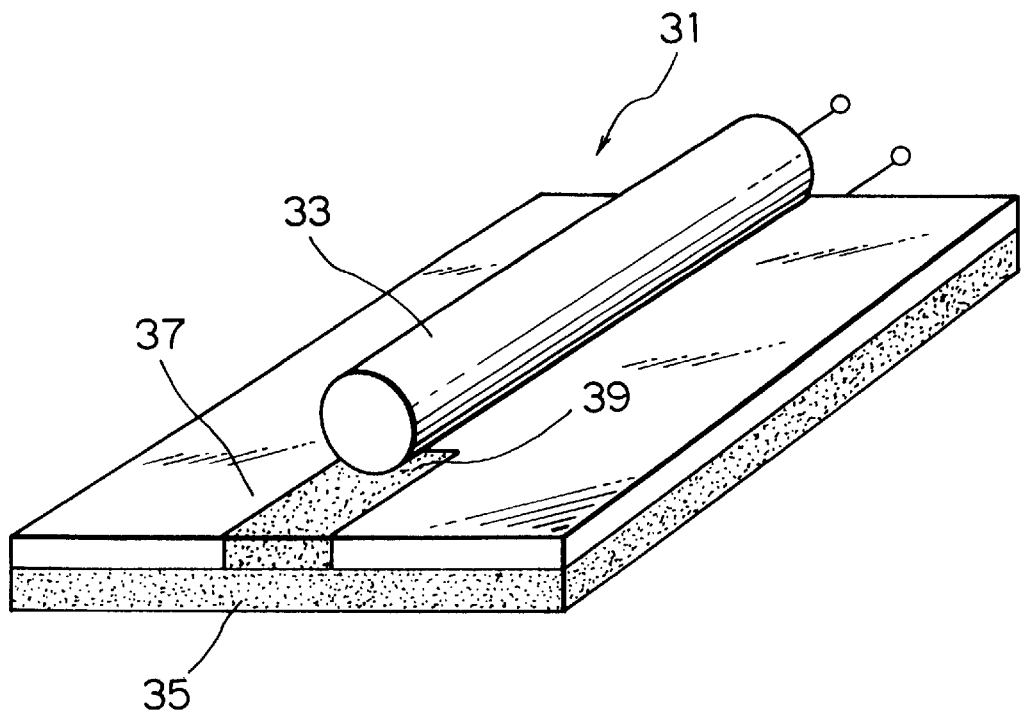
FIG. 2 is a perspective view of a magnetic sensor according to a first embodiment of this invention.

Referring to FIG. 2, a magnetic sensor 31 according to a first embodiment of this invention comprises an insulator substrate 37, a conductive soft magnetic wire 33 as a soft magnetic element supported on an upper surface of the insulator substrate 37, a ground conductor film 35 formed on a rear surface of the insulator substrate 37, and a connecting conductor 39 extending from a part of the upper surface of the insulator substrate 37 to a part of a side surface thereof to connect one end of the soft magnetic wire 33 and one end of the ground conductor film 35.

Figure 3:
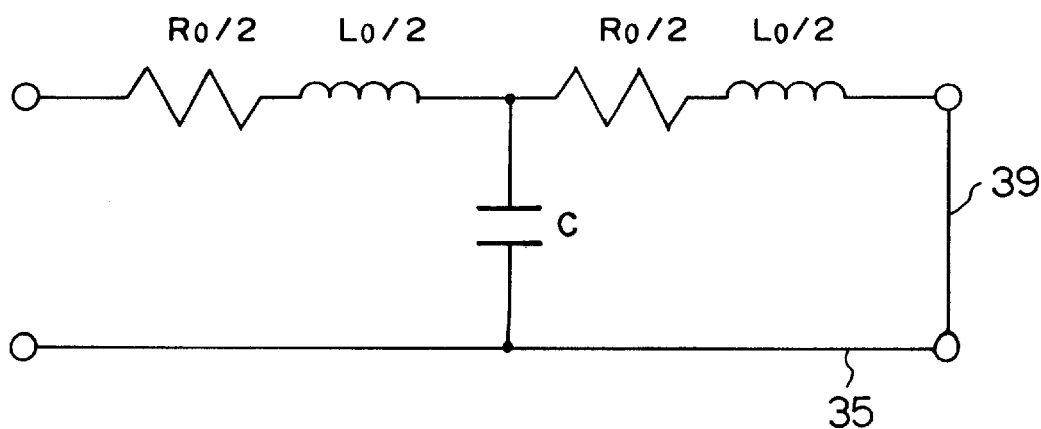
FIG. 3 shows an equivalent circuit of the magnetic sensor of FIG. 2.

The magnetic sensor 31 is a two-terminal element having two input terminals (upper right side in the figure) extracted from the soft magnetic wire 33 and the ground condutor film 35, respectively. This two-terminal element has an equivalent circuit illustrated in FIG. 3. In FIG. 3, a capacitance C is produced between the ground conductor film 35 and the soft magnetic wire 33. A resistance R, a reactance X, an impedance Z, and a resonant frequency f0 of the equivalent circuit are given by Equations (2) through (5):

$$R = \frac{R_0}{2} + \frac{2R_0}{\omega^4 L_0^2 C^2 + \omega^2(R_0^2 C^2 - 4L_0 C) + 4} \quad (2)$$

$$X = \frac{\omega L_0}{2} + \frac{\omega^4(2L_0 - R_0^2 C - \omega^2 L_0^2 C)}{\omega^4 L_0^2 C^2 + \omega^2(R_0^2 C^2 - 4L_0 C) + 4} \quad (3)$$

$$Z = R + j\omega X \quad (4)$$

$$f0 = \frac{1}{2\pi}\sqrt{\frac{2}{L_0 C}} \quad (5)$$

In the magnetic sensor having the equivalent circuit in FIG. 3, the impedance varies in response to the variation in strength of an external magnetic field and drastically varies around the resonant frequency f0. Thus, the impedance variation around the resonant frequency f0 is greater than in a frequency band much lower than the resonant frequency f0.

In the magnetic sensor according to the first embodiment of this invention, the impedance varies in response to application of the external magnetic field. As a consequence, the resonant frequency of the magnetic sensor varies also. Therefore, by optimizing the frequency of the electric current supplied to the magnetic sensor, the variation in external magnetic field can be detected as a very large impedance variation rate. In other words, magnetic field sensitivity can be increased.

Furthermore, the first embodiment includes the ground conductor film 35 so that occurrence of the stray capacitance in the prior art can be suppressed. In addition, electric field due to the electric current supplied to the soft magnetic wire 33 concentrates to an area between the ground conductor film 35 and the connecting conductor 39 through which the electric current flows. Therefore, the magnetic sensor is unsusceptible to disturbance and is therefore stable in operation as compared with the conventional magnetic sensor which does not have the ground conductor film 35. Accordingly, detection of the magnetic field can be stably carried out even when the magnetic sensor is operated in a frequency band lower than the resonant frequency in LC.

An example of the magnetic sensor of the first embodiment is as follows.

By the use of a permalloy wire having a diameter of 50 μm and a length of 5 mm as the soft magnetic wire 33 and a polyimide film as the insulator substrate 37 having a total thickness of 140 μm. The polyimide film has 35 μm-thick Cu foils formed on both surfaces thereof. One of the Cu foils on the polyimide film was used as the ground conductor film 35 while the other Cu foil was partially removed to leave the connecting conductor 39 to be short circuited to the one Cu foil as the ground conductor film 35. Furthermore, one end of the permalloy wire was soldered to the other Cu foil as the connecting conductor 39.

The magnetic sensor 31 thus obtained was subjected to measurement of the impedance variation. Specifically, a high-frequency current of 10 MHz was supplied between the other end of the permalloy wire 33 and the ground conductor film 35. The external magnetic field Hex was applied in a longitudinal direction of the permalloy wire 33. In this event, the impedance variation rate had a maximum value of 38%/Oe at Hex=3 Oe on the basis of a reference value at Hex=0 Oe.

Second Embodiment

Figure 4:
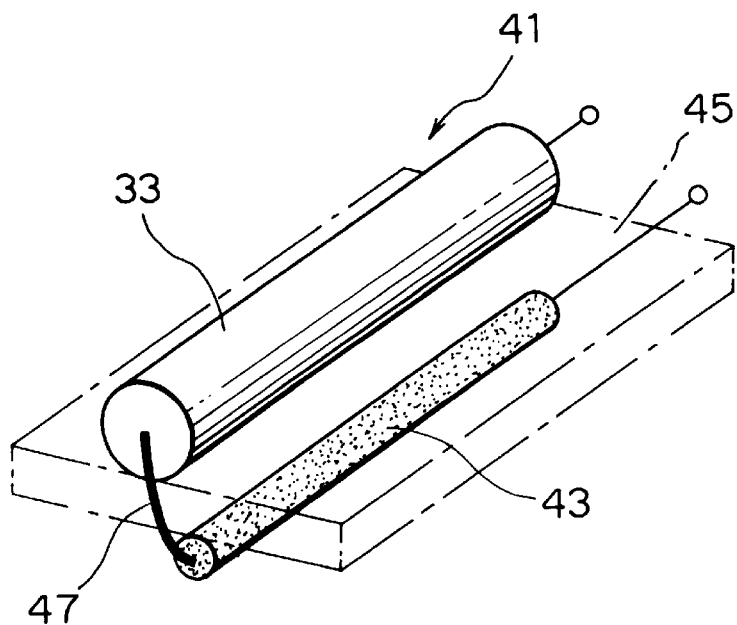
FIG. 4 is a perspective view of a magnetic sensor according to a second embodiment of this invention.

Referring to FIG. 4, a magnetic sensor 41 according to a second embodiment comprises an insulator film 45 as an insulator substrate, a soft magnetic wire 33 as a soft magnetic element attached to one surface of the insulator film 45, a conductor wire 43 as a ground conductor attached to the other surface of the insulator film 45 in parallel to the soft magnetic wire 33, and a short-circuiting conductor wire 47 as a connecting conductor connecting one ends of the soft magnetic wire 33 with the ground conductor wire 43. The magnetic sensor 41 is a two-terminal element having two external connection terminals at the other ends of the soft magnetic wire 33 and the ground conductor wire 43, respectively.

In the magnetic sensor 41, the soft magnetic wire 33, the ground conductor wire 43, the short-circuiting conductor wire 47, and the insulator film 45 correspond to the soft magnetic wire 33, the ground conductor film 35, the insulator 37, and the connecting conductor 39 in the magnetic sensor 31 of FIG. 2, respectively. Therefore, the magnetic sensor 41 is also represented by the equivalent circuit in FIG. 3 and its operation is substantially similar to that of the first embodiment.

An example of the magnetic sensor 41 of the second embodiment is as follows.

A permalloy wire having a diameter of 50 μm and a length of 5 mm as the soft magnetic wire 33 and a Cu wire having a diameter of 50 μm and a length of 5 mm as the ground conductor wire 43 were adhered to both surfaces of a polyimide film having a thickness of 70 μm as the insulator film 45, respectively. One ends of the permalloy wire and the Cu wire were short-circuited by the short-circuiting conductor wire 47 to obtain the magnetic sensor 41. The magnetic sensor 41 was then subjected to measurement of the impedance variation.

Specifically, a high-frequency current of 10 MHz was supplied between the other ends of the permalloy wire 33 and the Cu wire 43. In addition, an external magnetic field Hex was applied in the longitudinal direction of the permalloy wire 33. In this event, the impedance variation rate had a maximum value of 29%/Oe at Hex=30 Oe.

First Comparative Example

For the purpose of comparison, a permalloy wire having a diameter of 50 μm and a length of 5 mm was used alone and a high-frequency current of 10 MHz was supplied between both ends of the single permalloy wire. Then, an external magnetic field Hex was applied in the longitudinal direction of the permalloy wire. In this state, the impedance variation was detected. As a result, the impedance variation rate at Hex=30 Oe was no more than 8%/Oe.

Third Embodiment

Figure 5:
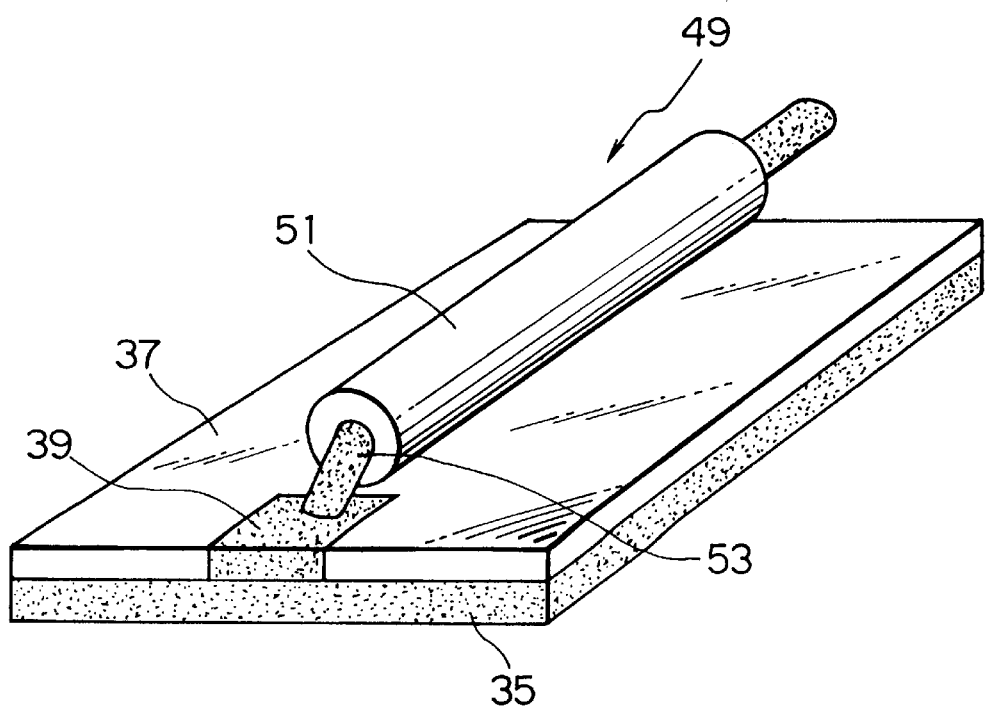
FIG. 5 is a perspective view of a magnetic sensor according to a third embodiment of this invention.

Referring to FIG. 5, a magnetic sensor 49 according to a third embodiment is similar to the magnetic sensor 31 of FIG. 2 except that the soft magnetic wire 33 is replaced by a soft magnetic tube 51 with a conductor wire inserted therethrough as a core wire 53. One end of the core wire 53 is connected to a connecting conductor 39 by soldering or the like.

As will readily be understood, the magnetic sensor 49 forms a two-terminal element also represented by the equivalent circuit in FIG. 3.

An example of the magnetic sensor 49 of the third embodiment is as follows.

Through a permalloy tube having an outer diameter of 200 μm as the soft magnetic tube 51, a Cu wire having a diameter of 100 μm as the core wire 53 was inserted in a generally coaxial form. A combination of the permalloy tube and the Cu wire will hereafter be called a coaxial soft magnetic wire for brevity of description. By the use of the coaxial soft magnetic wire and a polyimide film similar to that used in the first embodiment (i.e., having a total thickness of 140 μm with Cu films formed on both surfaces thereof), the magnetic sensor 49 in FIG. 5 was manufactured in the manner similar to the first embodiment. The magnetic sensor 49 thus obtained was subjected to measurement of the impedance variation. Specifically, a high-frequency current of 1 MHz was supplied between one ends of the core wire of the coaxial soft magnetic wire and a ground conductor film 35. Furthermore, an external magnetic field Hex was applied in the longitudinal direction of the permalloy tube. As a result, the impedance variation rate had a maximum value of 21%/Oe at Hex=4 Oe.

Fourth Embodiment

Figure 6:
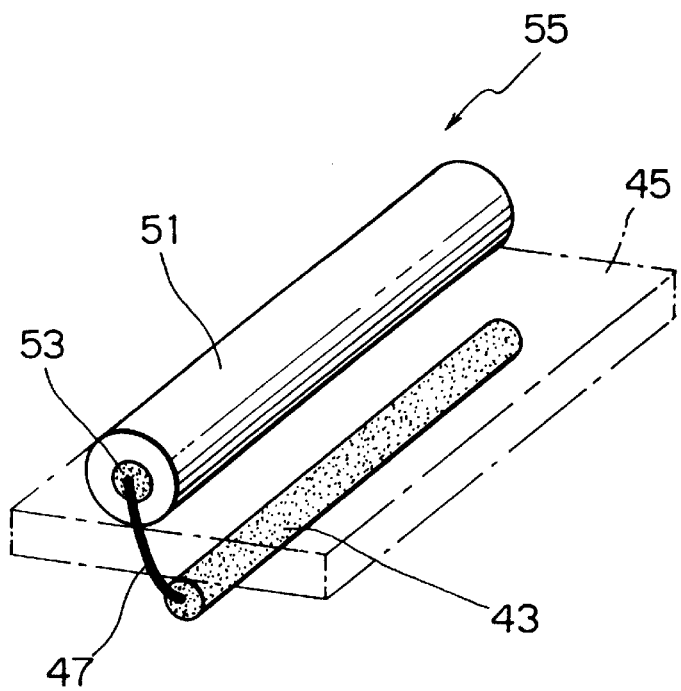
FIG. 6 is a perspective view of a magnetic sensor according to a fourth embodiment of this invention as a modification of the magnetic sensor in FIG. 5.

Referring to FIG. 6, a magnetic sensor 55 according to a fourth embodiment of this invention is a modification of the magnetic sensor of FIG. 5. The ground conductor film 35 and the ground conductor 39 in the magnetic sensor of FIG. 5 are replaced by a ground conductor wire 43 and a short-circuiting conductor wire 47, respectively, and a coaxial soft magnetic wire (51, 53) and the ground conductor wire 43 are attached to both surfaces of an insulator film 45, respectively, in the manner similar to the second embodiment (FIG. 4).

An example of the magnetic sensor 55 of the fourth embodiment is demonstrated as follows.

By the use of the coaxial soft magnetic wire (51, 53) comprising a permalloy tube (51) having an outer diameter of 200 μm and a Cu wire (53) having a diameter of 100 μm, together with a Cu wire (43) and a polyimide film (45) similar to those used in the second embodiment, the magnetic sensor 55 in FIG. 6 was manufactured. The magnetic sensor 55 thus obtained was subjected to measurement of the impedance variation in dependence upon the strength of an external magnetic field. Specifically, a high-frequency current of 1 MHz was supplied between one ends of the Cu wire 53 of the coaxial soft magnetic wire and the ground conductor wire 43 and the external magnetic field Hex was applied in the longitudinal direction of the permalloy tube 51. As a result, the impedance variation rate had a maximum value of 16%/Oe at Hex=4 Oe.

Second Comparative Example

Except that the ground conductor wire 43 was removed, a magnetic sensor similar to the magnetic sensor 55 of FIG. 6 was prepared as a comparative example. An electric current of 1 MHz was supplied between both ends of a conductor wire of a coaxial soft magnetic wire of the comparative example. In this state, the magnetic field dependency of an impedance was measured. As a result, the impedance variation rate had a maximum value as small as 6%/Oe at Hex=4 Oe.

Fifth Embodiment

Figure 7:
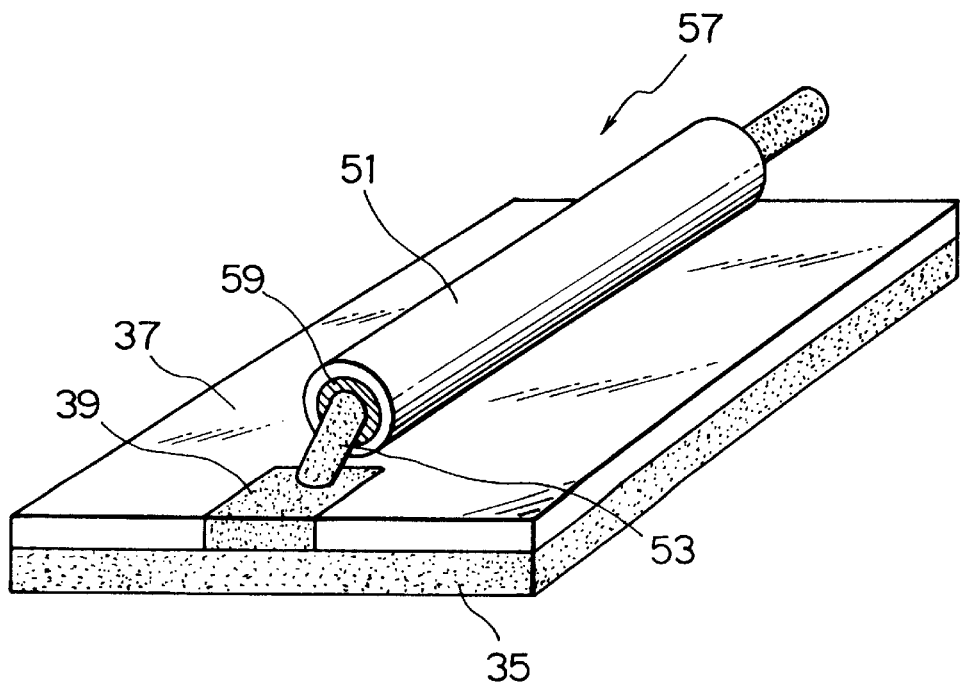
FIG. 7 is a perspective view of a magnetic sensor according to a fifth embodiment of this invention as another modification of the magnetic sensor in FIG. 5.

Referring to FIG. 7, a magnetic sensor 57 according to a fifth embodiment is a modification of the magnetic sensor of FIG. 5. Specifically, the magnetic sensor 57 has an insulator layer 59 interposed between a soft magnetic tube 51 and a core wire 53 forming a coaxial soft magnetic wire.

An example of the magnetic sensor 57 of the fifth embodiment is demonstrated as follows.

A Cu wire having a diameter of 0.5 mm as the core wire 53 was coated with a vinyl coating film as the insulator layer 59. Furthermore, the insulator layer 59 was coated with a permalloy foil having a thickness of 50 µm as the soft magnetic tube 51 to obtain the coaxial soft magnetic wire. Then, by the use of a polyimide film with Cu foils, the magnetic sensor 57 was manufactured in the manner similar to the first embodiment. The magnetic sensor 57 thus obtained was subjected to measurement of the impedance variation in dependence upon an external magnetic field. Specifically, a high-frequency current of 10 MHz was supplied between one ends of the core wire 53 of the coaxial soft magnetic wire and a ground conductor film 35. Furthermore, the external magnetic field Hex was applied in the longitudinal direction of the permalloy tube. As a result, the impedance variation rate had a maximum value of 48%/Oe at Hex=3 Oe.

Sixth Embodiment

Figure 8:
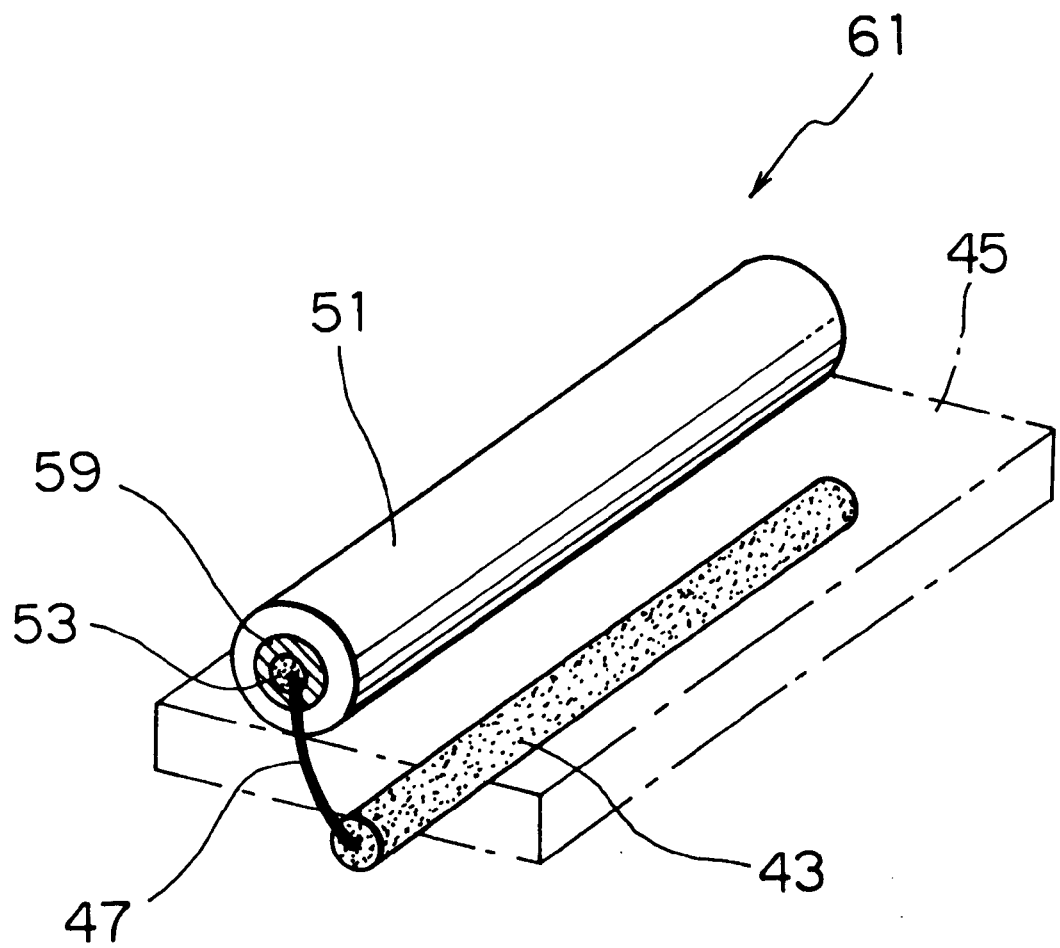
FIG. 8 is a perspective view of a magnetic sensor according to a sixth embodiment of this invention as a modification of the magnetic sensor in FIG. 6.

Referring to FIG. 8, a magnetic sensor 61 according to a sixth embodiment is a modification of the fourth (FIG. 6) or the fifth (FIG. 7) embodiment. Specifically, in the manner similar to FIG. 7, an insulator layer 59 is interposed between a soft magnetic tube 51 and a core wire 53 forming a coaxial soft magnetic wire in FIG. 6.

An example of the magnetic sensor 61 is demonstrated below.

By the use of a coaxial soft magnetic wire similar to that used in the fifth embodiment together with a Cu wire and a polyimide film similar to those used in the second embodiment, the magnetic sensor 61 in FIG. 8 was manufactured. The magnetic sensor 61 was then subjected to measurement of the impedance variation in dependence upon the strength of an external magnetic field. Specifically, a high-frequency current of 10 MHz was supplied between one ends of the core wire 53 of the coaxial soft magnetic wire and a ground conductor wire 43. Furthermore, the external magnetic field Hex was applied in the longitudinal direction of the permalloy tube. As a result, the impedance variation rate had a maximum value of 31%/Oe at Hex=3 Oe.

Third Comparative Example

As a third comparative example, the ground conductor wire 43 in the magnetic sensor 61 of FIG. 8 was removed to form a magnetic sensor comprising a coaxial soft magnetic wire having an insulator layer 59. An electric current of 10 MHz was supplied between both ends of the magnetic sensor to measure the magnetic field dependency of an impedance. As a result, the impedance variation rate had a maximum value as small as 8%/Oe at Hex=3 Oe.

Figure 9:
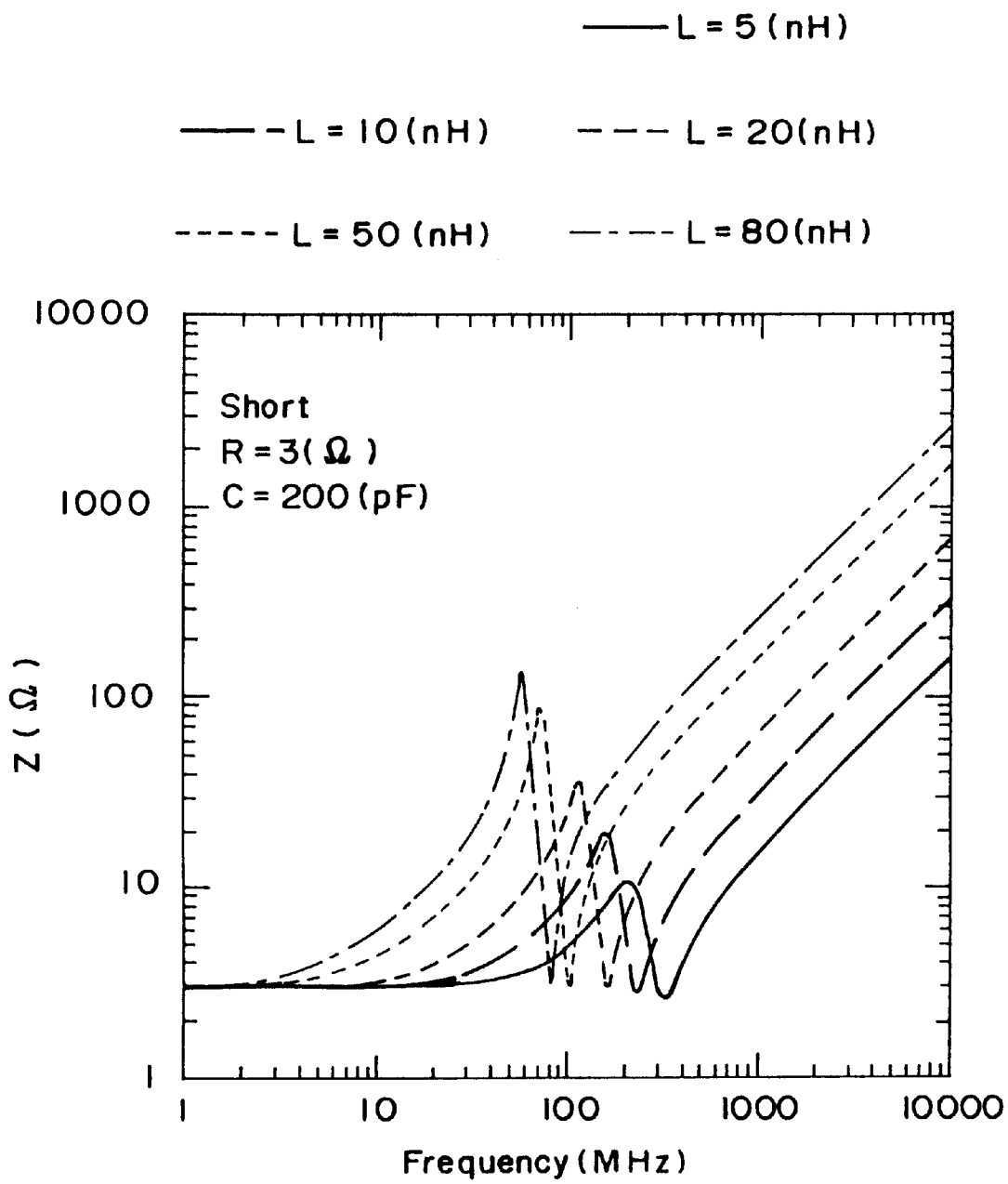
FIG. 9 is a graph showing the frequency dependency of an impedance with respect to various values of Lo in the equivalent circuit in FIG. 3.

As described above, the magnetic sensor according to each of the first through the sixth embodiments of this invention has the ground conductor so as to have the equivalent circuit illustrated in FIG. 3. In this case, the impedance variation in response to the variation in strength of the external magnetic field can be enlarged further by the use of LC resonance. To demonstrate the above, the value of the inductance L is changed in the equivalent circuit while the resistance R and the capacitance C are kept constant at 3Ω and 200 pF, respectively. According to Equations (2) through (4), the impedances Z are calculated and plotted in FIG. 9.

In the foregoing embodiments, permalloy is selected as a soft magnetic material. Instead, most of those metal materials generally used as the soft magnetic material can be used to achieve the similar effect as far as such material can be formed into a wire, for example, Co—Fe—Si—Bi.

As described above, the magnetic sensor according to each of the first through the sixth embodiments of this invention comprises the soft magnetic wire or the coaxial soft magnetic wire with the conductor core inserted therethrough, the ground conductor, and the insulator interposed therebetween. With this structure, it is possible to suppress occurrence of the stray capacitance between the soft magnetic element and surrounding conductors and to achieve stable operation by protection against the disturbance. In addition, by utilizing the capacitance produced from addition of the insulator and the conductor, the LC resonance frequency can be freely designed. By utilizing the drastic change in impedance following the variation of the inductance L in dependence upon the external magnetic field, the sensitivity can be remarkably improved from several times to several tens of times as compared with the conventional sensors. In addition, the magnetic sensor of this invention simply comprises the wire material as the soft magnetic element to which the insulator including the conductor layer or a combination of the insulator and the conductor wire is added. Thus, the number of components is reduced and an expensive installation such as a sputtering apparatus is not required so that the magnetic sensor is obtained at a low cost. Therefore, the magnetic sensor of this invention is extremely useful for use as a magnetic head and the like.

Seventh Embodiment

Figure 10:
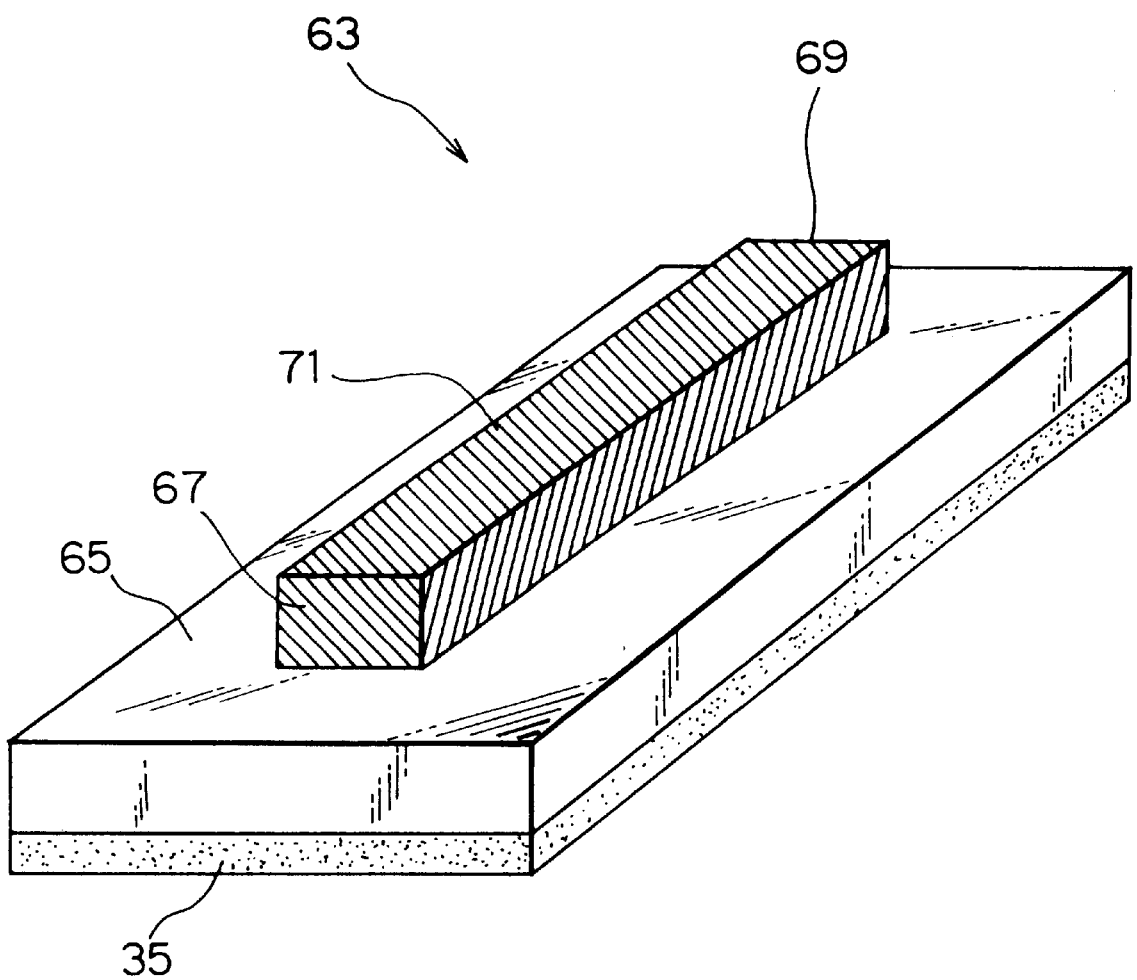
FIG. 10 is a perspective view of a magnetic sensor according to a seventh embodiment of this invention.

Referring to FIG. 10, a magnetic sensor 63 according to a seventh embodiment of this invention comprises a dielectric plate member or a glass substrate 65 as an insulator substrate having upper and lower surfaces along a predetermined direction, and a linear strip-like soft magnetic thin film 71 as a soft magnetic element having a preselected width and deposited on a part of the upper surface of the glass substrate 65 to extend in the predetermined direction. The soft magnetic thin film 71 has opposite ends as input and output ends 67 and 69 for supply of an electric current therebetween. The magnetic sensor 63 is for detecting, as the impedance variation, the variation in electric current which is caused when the soft magnetic thin film 71 is applied with a magnetic field in a direction intersecting the predetermined direction. In the magnetic sensor 63, the capacitance is intentionally provided by depositing a ground conductor film 35 as a conductor on the lower surface of the glass substrate 65.

The soft magnetic thin film 71 forms a two-terminal element having the input and the output ends 67 and 69. The two-terminal element has an equivalent circuit as illustrated in FIG. 3. In FIG. 3, C represents a capacitance intentionally formed between the ground conductor film 35 and the soft magnetic thin film 71. The equivalent circuit has a resistance R, a reactance X, and an impedance Z given by Equations (2) through (4), respectively, and has a resonant frequency given by Equation (5), as described in the foregoing.

In the element having the equivalent circuit in FIG. 3, the impedance of the element varies in response to the variation in external magnetic field. It is noted here that the impedance drastically varies around the resonant frequency. Therefore, by monitoring the variation of impedance around the resonant frequency, wider output variation can be obtained as compared with monitoring at a low frequency range much lower than the resonant frequency.

The magnetic sensor in this embodiment has the capacitance C intentionally provided so that the operation is stable as compared with the conventional magnetic sensors which does not have the ground conductor film 35. Accordingly, detection of the magnetic field can be stably carried out even when the magnetic sensor is operated in a frequency band lower than the resonant frequency in LC resonance of the above-mentioned conventional magnetic sensor.

Description will be made about a method of manufacturing the magnetic sensor 63 in the seventh embodiment (FIG. 10) by the use of high-frequency magnetron sputtering.

At first, the glass substrate 65 having a thickness of 200 $\mu$m, a width of 10 mm, and a length of 20 mm was prepared. Then, the linear strip-like soft magnetic thin film 71 of Co—Nb—Zr having a thickness of 4 $\mu$m, a width of 4 mm, and a length of 14 mm was deposited on a part of the upper surface of the glass substrate 65 by the sputtering. Subsequently, the ground conductor film 35 of Cu having a thickness of 1 $\mu$m, a width of 10 mm, and a length of 20 mm was also deposited on the lower surface of the glass substrate 65. The soft magnetic thin film 71 was analyzed by EPMA (Electron Probe Microanalysis) to have a composition of 83.7 at % Co, 2.8 at % Zr, and 13.5 at % Nb.

The magnetic sensor 63 was heated at 400° C. for 2 hours in a vacuum of $5.0 \times 10^{-5}$ Torr or less under a rotating magnetic field of H=500 Oe to relax magnetic anisotropy having been introduced during deposition of the films. Thereafter, in a vacuum of the same degree under a static magnetic field of the same level, heat treatment was carried out to introduce uniaxial magnetic anisotropy in a widthwise direction of the magnetic sensor 63.

Figure 11:
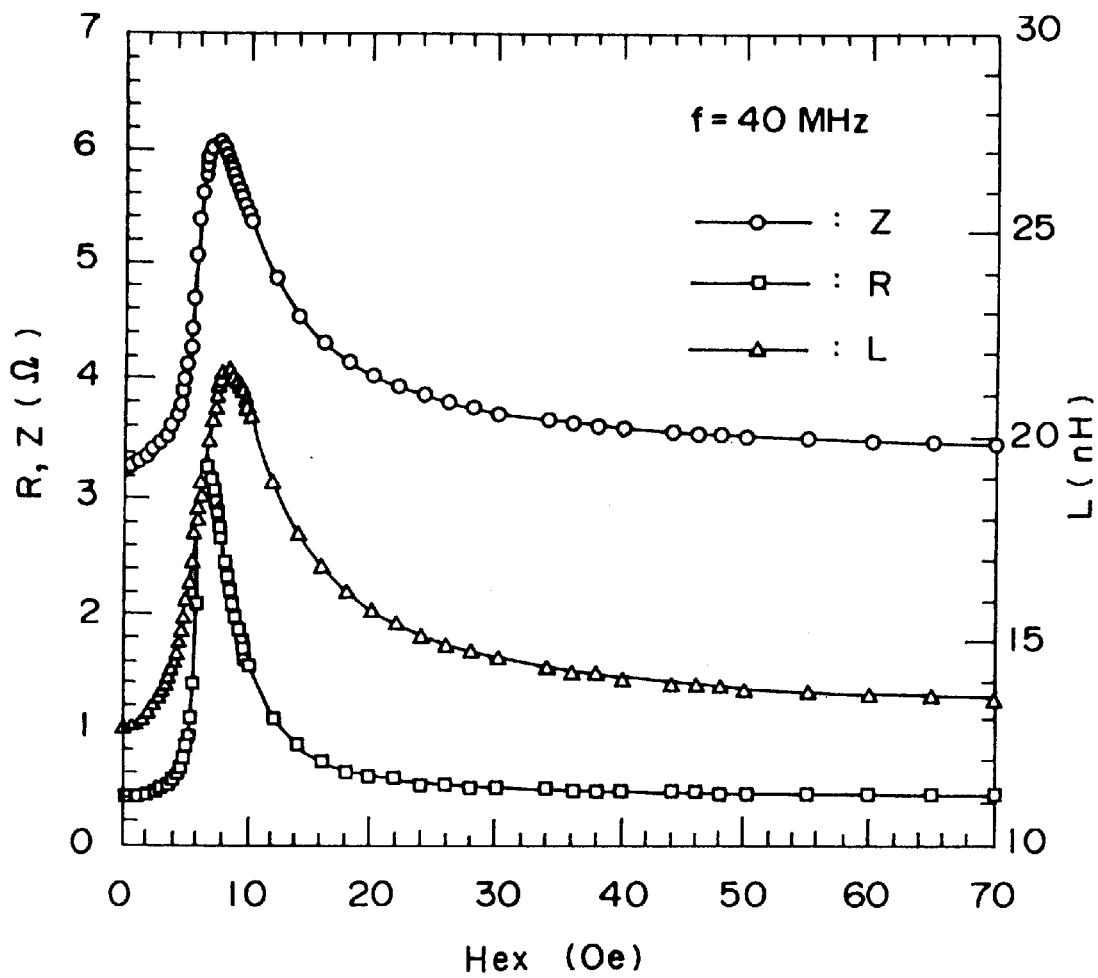
FIG. 11 shows the external magnetic field dependency of an impedance Z, a resistance R, and an inductance L.

The magnetic sensor 63 as treated was supplied with an electric current of 40 MHz and was measured for the impedance dependent on various external magnetic field (Hex). The measured data are illustrated in FIG. 11. The impedance variation rate was 188%/7.6 Oe and the average magnetic field sensitivity was 24.7%/Oe. The maximum magnetic field sensitivity was 65.8%/Oe at Hex=7 Oe.

Fourth Comparative Example

As a fourth comparative example, a magnetic sensor was experimentally prepared which is similar to the magnetic sensor of the seventh embodiment (FIG. 10) except that the ground conductor film 35 is not formed under the glass substrate 65. A process of forming the soft magnetic thin film 71 of Co—Nb—Zr on the upper surface of the glass substrate 65 was carried out in the similar manner as the manufacture of the example of the magnetic sensor 31 of the seventh embodiment of FIG. 10. After forming the soft magnetic thin film 71, heat treatment was also carried out in the similar manner. The soft magnetic thin film 71 was also analyzed to have a composition of 83.6 at % Co, 2.7 at % Zr, and 13.7 at % Nb. An electric current of 40 MHz was supplied to the magnetic sensor of the fourth comparative example and the external magnetic field dependency of the impedance was measured. The impedance variation rate was 37%/8.6 Oe and the average magnetic field sensitivity was 4.3%/Oe. The maximum magnetic field sensitivity was 9.5%/Oe at Hex=70 Oe.

Eighth Embodiment

Figure 12:
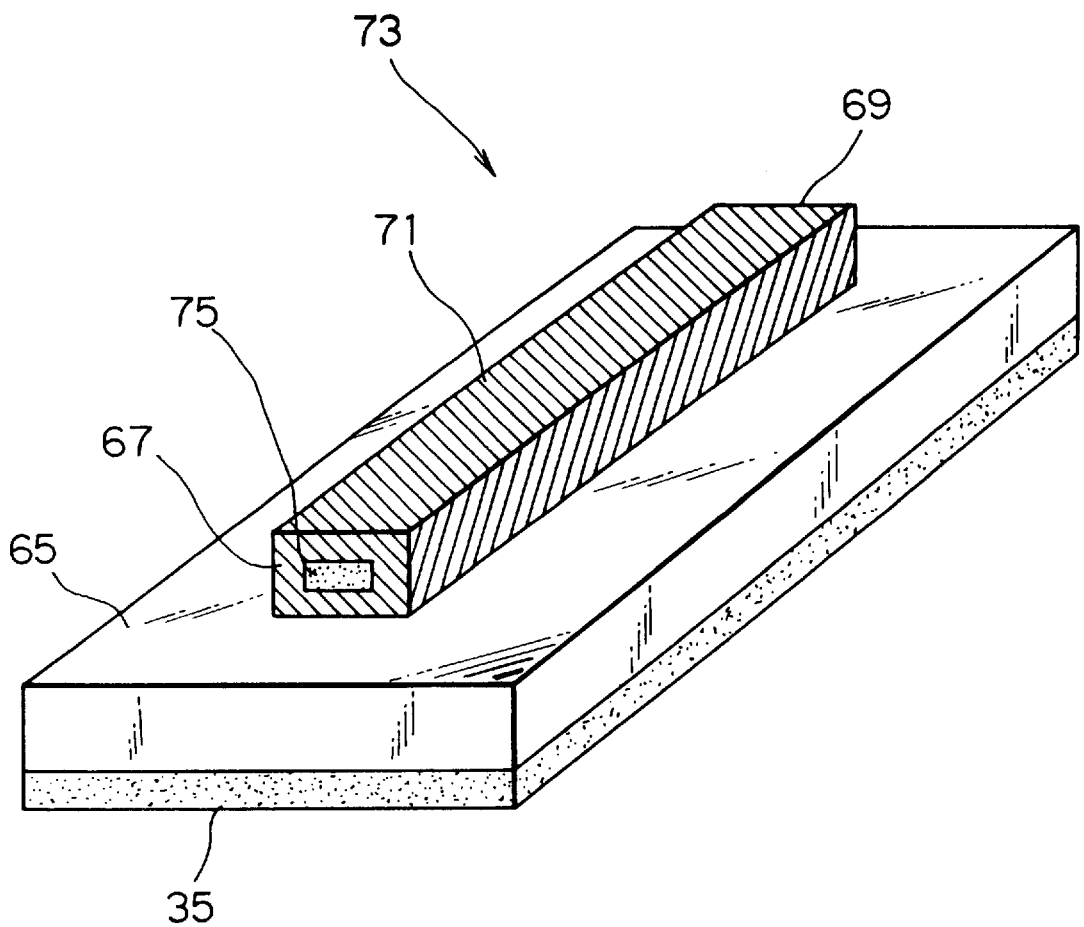
FIG. 12 is a perspective view of a magnetic sensor according to an eighth embodiment of this invention.

Referring to FIG. 12, a magnetic sensor 73 according to an eighth embodiment manufactured by magnetron sputtering is different from that of the seventh embodiment as will hereafter be described in detail.

The magnetic sensor 73 of the eighth embodiment was manufactured as follows. A glass substrate 65 having a thickness of 200 $\mu$m, a width of 10 mm, and a length of 20 mm was prepared. Then, a lower portion of a linear strip-like soft magnetic thin film 71 of Co—Nb—Zr having a thickness of 4 $\mu$m, a width of 4 mm, and a length of 14 mm was deposited on a part of the upper surface of the glass substrate 65. Subsequently, a Cu film 75 having a thickness of 1 $\mu$m, a width of 2 mm, and a length of 20 mm was formed on a center line of the lower portion of the soft magnetic thin film 71. Thereafter, on the lower portion of the soft magnetic thin film 71 over the upper surface of the Cu film 75, an upper portion of the soft magnetic thin film 71 of Co—Nb—Zr was deposited to have a maximum thickness of 4 $\mu$m, a width of 4 mm, and a length of 14 mm. Finally, on the lower surface of the glass substrate 65, a ground conductor film 35 of Cu was deposited which has a thickness of 1 $\mu$m, a width of 10 mm, and a length of 20 mm.

The soft magnetic thin film 71 was also analyzed to have a composition of 83.4 at % Co, 3.0 at % Zr, and 13.6 at % Nb.

In the manner similar to the seventh embodiment, uniaxial magnetic anisotropy was introduced into the magnetic thin film 71 in a widthwise direction thereof. Subsequently, the magnetic sensor 73 was supplied with an electric current of 80 MHz and the impedance variation rate was measured by application of the external magnetic field varied. The impedance variation rate was 85%/8.1 Oe and the average magnetic field sensitivity was 10.7%/Oe. The maximum magnetic field sensitivity was 25.1%/Oe at Hex=7 Oe.

Fifth Comparative Example

A magnetic sensor of a fifth comparative example was experimentally prepared which is similar to the magnetic sensor 73 of the eighth embodiment (FIG. 12) except that the ground conductor film 35 was not formed on the lower surface of the glass substrate 65. Thus, the magnetic sensor of the fifth comparative example comprises the soft magnetic thin film 71 of Co—Nb—Zr and the Cu film 75 formed on the upper surface of the glass substrate 65.

Under the condition similar to the eighth embodiment, heat treatment was carried out to introduce magnetic anisotropy. Thereafter, an electric current of 80 MHz was supplied. In this state, the external magnetic field (Hex) dependency of the impedance was measured. As a result, the impedance variation rate was 50%/9 Oe and the average magnetic field sensitivity was about 6%/Oe. The maximum magnetic field sensitivity was 12.3%/Oe at Hex=7 Oe.

Ninth Embodiment

Figure 13:
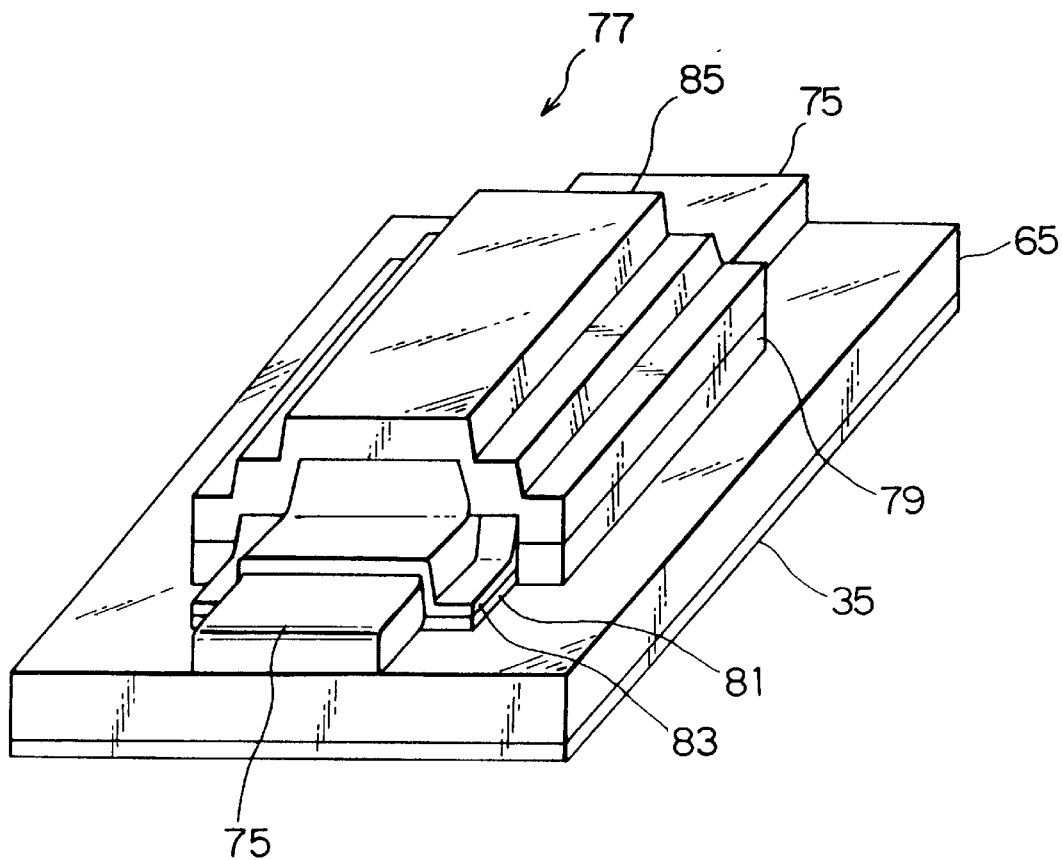
FIG. 13 is a perspective view of a magnetic sensor according to a ninth embodiment of this invention.
Figure 14:
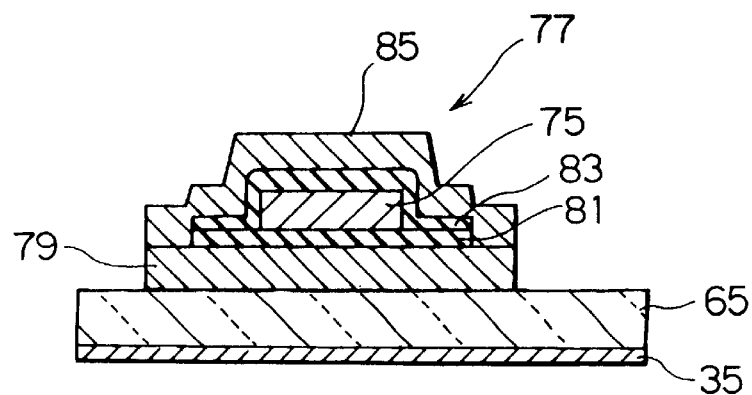
FIG. 14 is a sectional view of the magnetic sensor in FIG. 13.

Referring to FIGS. 13 and 14, a magnetic sensor 77 according to a ninth embodiment was manufactured by magnetron sputtering in the manner which will presently be described. At first, a glass substrate 65 having a thickness of 200 μm, a width of 10 mm, and a length of 20 mm was prepared. Then, a first linear strip-like soft magnetic thin film 79 of Co—Nb—Zr having a thickness of 4 μm, a width of 4 mm, and a length of 14 mm was deposited on a part of the upper surface of the glass substrate 65. Thereafter, on the first soft magnetic thin film 79, a first $SiO_2$ film 81 having a thickness of 0.5 μm, a width of 3 mm, and a length of 18 mm was formed. Subsequently, a Cu film 75 having a thickness of 1 μm, a width of 2 mm, and a length of 20 mm was deposited on the first $SiO_2$ film 81. Furthermore, on the first $SiO_2$ film 81 and the Cu film 75, a second $SiO_2$ film 83 having a thickness of 0.5 μm, a width of 3 mm, and a length of 18 mm was formed. Furthermore, on the first soft magnetic thin film 79 and the second $SiO_2$ film 83, a second linear strip-like soft magnetic thin film 85 having a thickness of 4 μm, a width of 4 mm, and a length of 14 mm was formed. Finally, a ground conductor film 35 of Cu having a thickness of 1 μm, a width of 10 mm, and a length of 20 mm was deposited on the lower surface of the glass substrate 65.

Each of the first and the second soft magnetic thin films 79 and 85 had a composition of 84.1 at % Co, 2.7 a % Zr, and 13.2 at % Nb as analyzed by EPMA.

In the manner similar to the seventh embodiment, uniaxial magnetic anisotropy was introduced into the magnetic thin films 79 and 85 in a widthwise direction thereof. Then, the magnetic sensor 77 was supplied with an electric current of 120 MHz and the impedance was measured as the external magnetic field Hex of various strengths is applied. As a result, the impedance variation rate was 35%/8.0 Oe and the average magnetic field sensitivity was 43.8%/Oe. At Hex=7 Oe, a curve representative of the impedance variation with respect to the external magnetic field Hex exhibited the maximum gradient with the maximum impedance variation rate of 205%/Oe.

Sixth Comparative Example

A magnetic sensor of a sixth comparative example was experimentally prepared which is similar to the magnetic sensor 77 of the ninth embodiment (FIGS. 13 and 14) except that the ground conductor film 35 was not formed on the lower surface of the glass substrate 65.

Under the condition similar to the ninth embodiment, heat treatment was carried out to introduce magnetic anisotropy. Thereafter, an electric current of 120 MHz was supplied. In this state, the external magnetic field dependency of the impedance was measured. As a result, the impedance variation rate was 120%/8.2 Oe and the average magnetic field sensitivity was about 14.6%/Oe. The maximum magnetic field sensitivity was 23%/Oe at Hex=7 Oe.

Tenth Embodiment

Figure 15:
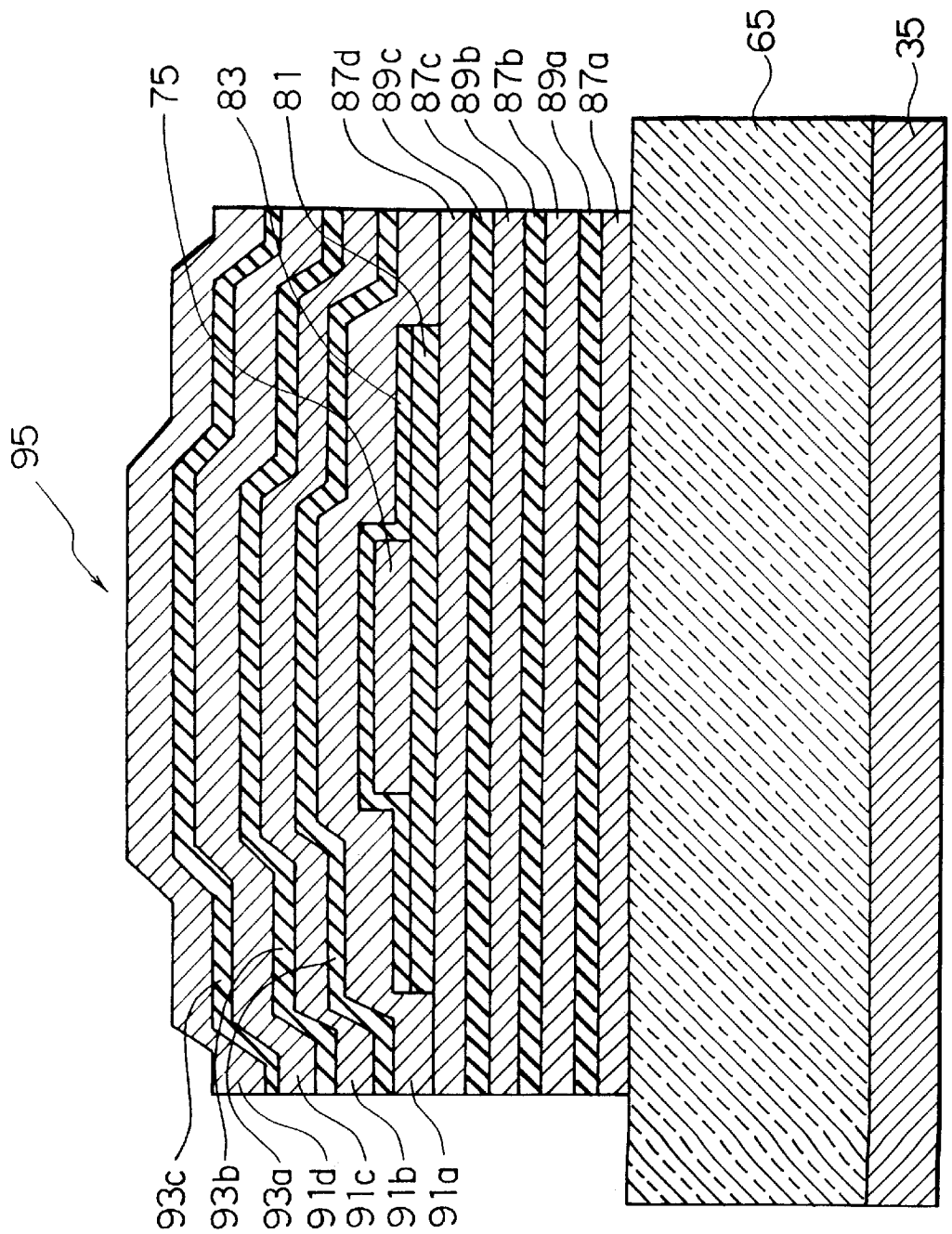
FIG. 15 is a sectional view of a part of a magnetic sensor according to a tenth embodiment of this invention as a modification of that of FIG. 11.

Referring to FIG. 15, a magnetic sensor 95 according to a tenth embodiment has a structure similar to the magnetic sensor 77 of the ninth embodiment (FIGS. 15 and 16) except that the first and the second soft magnetic thin films 79 and 85 are replaced by first and second soft magnetic layers 87 and 91 each of which has a stacked structure.

The magnetic sensor 95 was manufactured in the following manner. At first, a glass substrate 65 having a thickness of 200 μm, a width of 10 mm, and a length of 20 mm was prepared. Then, on a part of the upper surface of the glass substrate 65, a soft magetic thin film 87a of Co—Nb—Zr having a thickness of 1 μm, a width of 4 mm, and a length of 14 mm was deposited. Subsequently, on the soft magnetic thin film 87a, an AlN film 89a having a thickness of 0.1 μm, a width of 4 mm, and a length of 18 mm was formed. Likewise, similar soft magnetic thin films 87b through 87d and similar AlN films 89b and 89c were alternately deposited to form the first soft magnetic layer 87 of a stacked structure with three AlN films interposed. Thereafter, on the first soft magnetic layer 87, specifically, on a part of the upper surface of the topmost soft magnetic thin film 87d, an AlN film 81 having a thickness of 0.5 μm, a width of 3 mm, and a length of 18 mm was deposited. Subsequently, a Cu film 75 having a thickness of 1 μm, a width of 2 mm, and a length of 20 mm was formed on the AlN film 81 except both ends thereof. Then, on the AlN film 81 and the Cu film 75, an AlN film 83 having a thickness of 0.5 μm, a width of 3 mm, and a length of 18 mm was formed. Then, on the AlN film 83 and on the first soft magnetic layer 87, namely, on the uppermost soft magnetic thin film 87d, another set of soft magnetic thin films 91a through 91d of Co—Nb—Zr and three AlN films 93a through 93c are alternately deposited to form the second soft magnetic layer 91 with the three AlN films interposed. Finally, a ground conductor film 35 of Cu having a thickness of 1 μm, a width of 10 mm, and a lengthof 20 mm was deposited on the lower surface of the glass substrate 65. Each of the soft magnetic thin films 87a through 87d and 91a through 91d had a composition of 83.5 at % Co, 3.1 at % Zr, and 13.4 at % Nb.

In the manner similar to the seventh embodiment, uniaxial magnetic anisotropy was introduced into the soft magnetic layers in a widthwise directions thereof. Then, the magnetic sensor 95 was supplied with an electric current of 120 MHz and the impedance was measured in the external magnetic field (Hex) with the strength variously changed. As a result, the impedance variation rate was 212%/8.0 Oe and the average magnetic field sensitivity was 26.5%/Oe. The maximum magnetic sensitivity was 128%/Oe at Hex=7 Oe.

Seventh Comparative Example

A magnetic sensor of a seventh comparative example was experimentally prepared which is similar to the magnetic sensor 77 of the ninth embodiment (FIG. 15) except that the ground conductor film 35 is not formed on the lower surface of the glass substrate 65. Heat treatment was carried out in the condition similar to that of the ninth embodiment to introduce magnetic anisotropy. Thereafter, an electric current of 120 MHz was supplied. In this state, the external magnetic field dependency of the impedance was measured. As a result, the impedance variation rate was 83%/8.5 Oe and the average magnetic field sensitivity was about 9.8%/Oe. The maximum magnetic field sensitivity was 22.5%/Oe at Hex=7 Oe.

Eleventh Embodiment

A magnetic sensor according to an eleventh embodiment is similar to the magnetic sensor 77 of the ninth embodiment (FIGS. 13 and 14) except that the soft magnetic thin films 81 and 83 of Co—Nb—Zr are replaced by permalloy of 4 μm thickness.

The magnetic sensor was heated at 500° C. for 2 hours in a vacuum of $5.0 \times 10^{-6}$ Torr or less under a static magnetic field of H=500 Oe to introduce uniaxial magnetic anisotropy in a widthwise direction thereof. Thereafter, the magnetic sensor was supplied with an electric current of 40 MHz, and the external magnetic field (Hex) dependency of an impedance, an inductance, and a resistance was measured. The impedance variation rate was 72%/40 Oe and the average magnetic field sensitivity was 18.0%/Oe. The maximum magnetic field sensitivity was 43%/Oe at Hex=2.5 Oe.

Eighth Comparative Example

A magnetic sensor of an eighth comparative example was experimentally manufactured which is similar to the magnetic sensor in the eleventh embodiment except that the ground conductor film (35 in FIGS. 13 and 14) is omitted. Like in the eleventh embodiment, an electric current of 40 MHz was supplied. In this state, the magnetic field dependency of the impedance was measured. As a result, the impedance variation rate was 35%/4.1 Oe and the average magnetic field sensitivity was about 8.5%/Oe. The maximum magnetic field sensitivity was 16%/Oe at Hex=2.5 Oe.

According to each of the seventh through the eleventh embodiments of this inventions described above, in the magnetic sensor using the soft magnetic thin film to detect, as impedance variation, variation in strength of the external magnetic field, the ground conductor film (ground electrode) is formed so as to intentionally provide the capacitance. Therefore, the magnetic sensor is advantageous in that the operation is stable and that the drastic change in impedance accompanying LC resonance in the equivalent circuit in FIG. 3 can be utilized. Thus, the disadvantages in the above-mentioned conventional sensors can be readily removed.

The value of the capacitance C in the equivalent circuit in FIG. 3 can be selected to a specific value in a design stage. The resistance $R_0$ and the inductance $L_0$ illustrated in the figure vary in dependence upon the external magnetic field.

Figure 16:
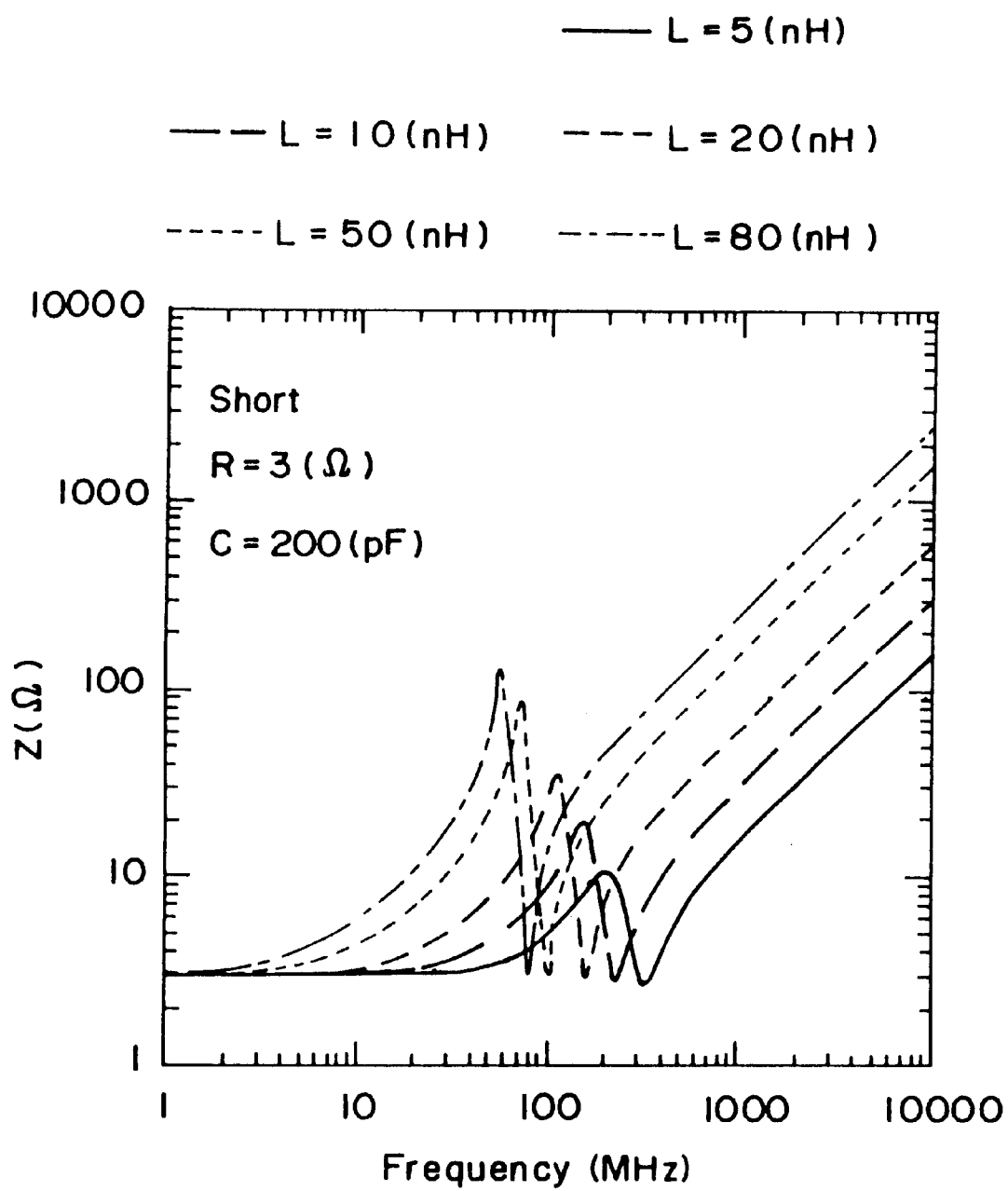
FIG. 16 shows the frequency dependency of the impedance of the magnetic sensor of FIG. 10.

Specifically, in the equivalent circuit having the impedance given by Equations (2) through (4), the inductance L is variously changed with the resistance R and the capacitance C kept constant at 3Ω and 200 pF, respectively. In this state, the impedance is calculated as plotted in FIG. 16. As already described, in the magnetic sensor of each of the seventh through the eleventh embodiments of this invention, the permeability of the soft magnetic films is varied under the influence of the external magnetic field. Therefore, the variation of the inductance L shown in FIG. 16 is actually caused by the external magnetic field. For example, it is assumed that, when an electric current of 70 MHz is supplied, the permeability is increased by application of the external magnetic field and the inductance L varies from 20nH to 5 nH. In this event, the impedance varies from 12Ω to 80Ω, exhibiting the variation rate of 600% or more. Practically, since the electric resistance is varied under the influence of the skin effect, the situation is not so simple.

Figure 17:
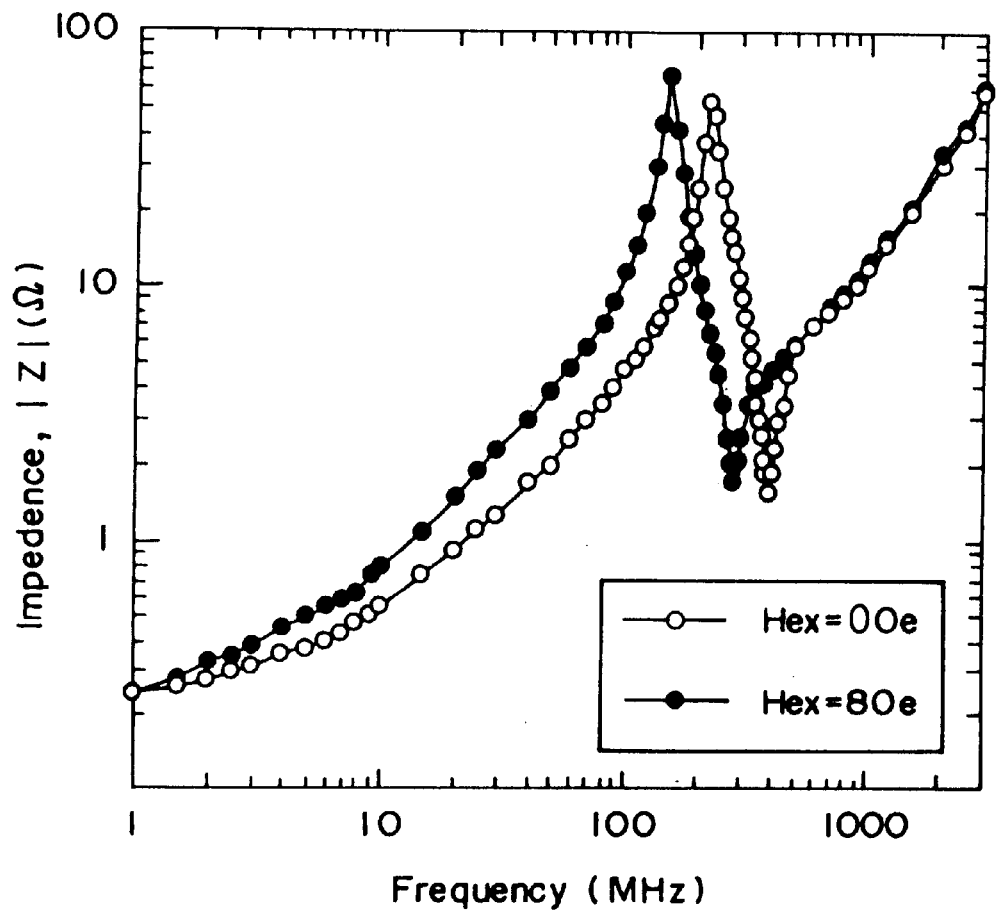
FIG. 17 shows the frequency dependency of the impedance Z, the resistance R, and the inductance L of the magnetic sensor of FIG. 13.

FIG. 17 shows the frequency dependency of the impedance measured in the ninth embodiment, which has a tendency substantially identical with that illustrated in FIG. 16. Thus, it will be noted that the impedance variation following application of the magnetic field to the magnetic sensor causes the variation of the resonant frequency of the magnetic sensor. Therefore, by optimizing the frequency of the electric current supplied, the variation in strength of the external magnetic field can be detected as a very large impedance variation rate.

In the ninth and the tenth embodiments, the soft magnetic thin film is formed by amorphous Co—Nb—Zr. In the eleventh embodiment, permalloy is used. However, any material excellent in soft magnetic effect can be used instead. In place of the Cu film, any material selected from low-resistance electrode metals such as Al, Ag, and Au can be used. The insulator film may be formed by various compounds excellent in insulation, such as $Al_2O_3$ and $Si_3O_4$, instead of $SiO_2$ and AlN.

Now, description will be made as regards a magnetic sensor having the soft magnetic element comprising a Co—Nb—Zr film similar to the ninth and the tenth embodiments shown in FIGS. 13, 14, and 15 but having no ground conductor film as have been described as the sixth and the seventh comparative examples. It should be noted that the magnetic sensor without the ground conductor film is provided with an improved magnetic field sensitivity above 15%/Oe by the use of the Co—Nb—Zr film of a specific composition essentially consisting of 80–87 at % Co, 10–17 at % Nb, and 1–6 at % Zr.

Twelfth Embodiment

This embodiment is similar to the ninth embodiment of FIGS. 13 and 14 but without the ground conductor film 35 as in the sixth comparative example.

Figure 18:
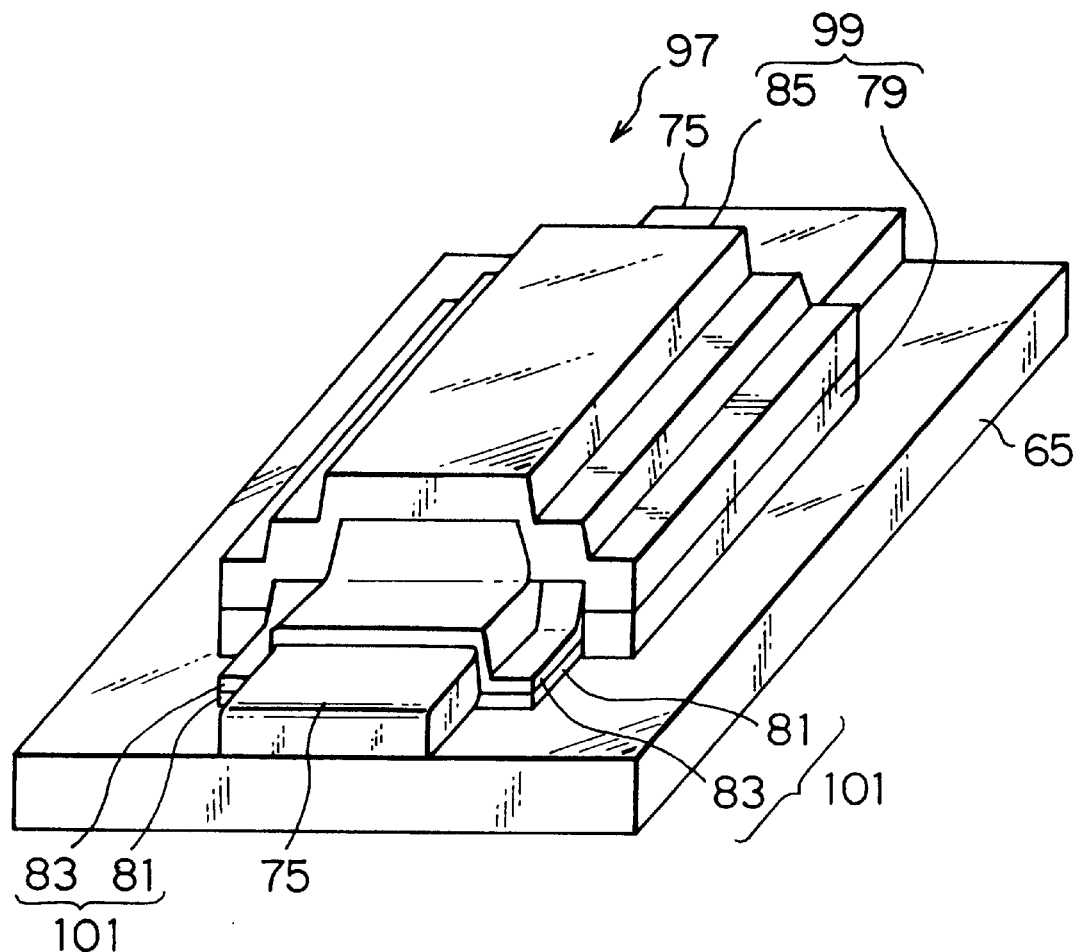
FIG. 18 is a perspective view of a magnetic sensor according to a twelfth embodiment of this invention.
Figure 19:
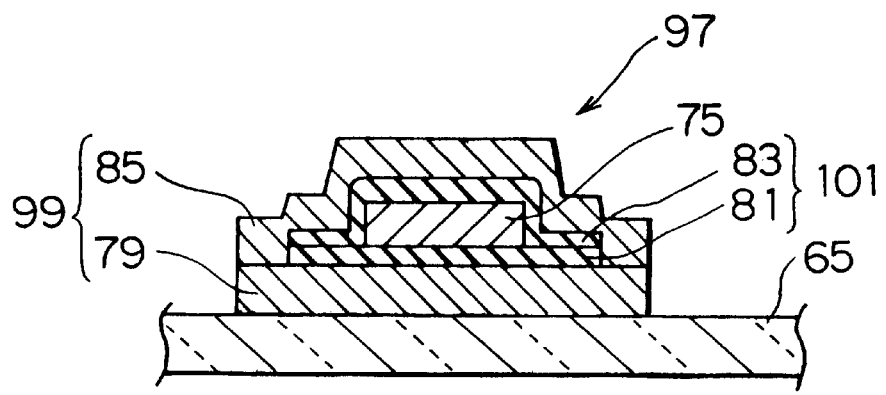
FIG. 19 is a cross sectional view of the magnetic sensor illustrated in FIG. 18.
Figure 20:
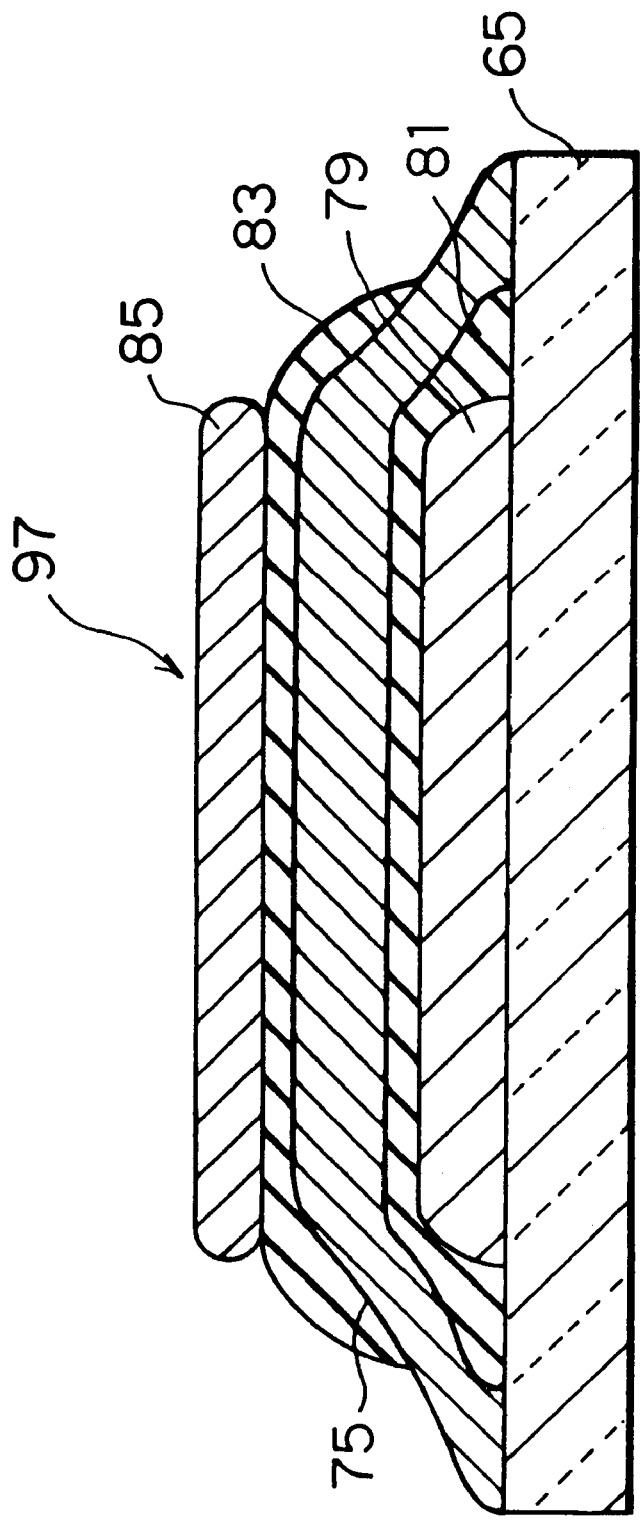
FIG. 20 is a longitudinal sectional view of the magnetic sensor illustrated in FIG. 18.

Referring to FIGS. 18 through 20, a magnetic sensor 85 according to a twelfth embodiment of this invention comprises a glass substrate 65 as an insulator substrate, and a soft magnetic element formed on the glass plate 65. The magnetic element is a clad type structure and comprises, as an outer clad layer of the soft magnetic element, a soft magnetic layer 99 comprising a Co—Nb—Zr film having a thickness of 1μm, a Cu film 75 as a core conductor of the soft magnetic element, having a thickness of 1 μm and formed at a center portion, an insulator layer 101 comprising 0.5 μm-thick $SiO_2$ films 81 and 83 interposed between the soft magnetic layer 99 and the conductor layer 75.

The soft magnetic layer 99 comprises a first soft magnetic thin film 79 formed on the glass substrate 65, and a second soft magnetic thin film 85 formed on and above the first soft magnetic thin film 79. The insulator layer 101 comprises the $SiO_2$ films 81 and 83 as first and second insulator films. The first insulator film 81 is interposed between the Cu film 75 and the first soft magnetic thin film 79 while the second insulator film 83 is interposed between the Cu film 75 and the second soft magnetic thin film 85. The first and the second insulator films 81 and 83 are kept in tight contact with each other at opposite peripheral portions thereof.

The magnetic sensor 97 of the twelfth embodiment was manufactured as follows to obtain samples 1 through 10. In addition, comparative samples 11 through 15 were obtained as a ninth comparative example.

Referring to FIGS. 21A through 21F, the magnetic sensor 97 having the structure illustrated in FIGS. 18 through 20 was manufactured on the glass substrate 65 having a thickness of 1 mm. By the use of Co—Nb—Zr alloy targets of a several kinds of compositions, an Nb pellet, and a Zr pellet, Co—Nb—Zr films of different compositions were formed. The compositions of the Co—Nb—Zr films deposited were analyzed by EPMA.

At first referring to FIG. 21A, a mask was formed on the glass substrate 65 having a dimension of 10 mm×20 mm. As illustrated in FIG. 21B, the first soft magnetic thin film 79 of Co—Nb—Zr having a width of 4 mm, a length of 14 mm, and a thickness of 1 μm was formed by sputtering. Next referring to FIG. 21C, the first insulator film 81 of $SiO_2$ having a width of 3 mm, a length of 16 mm, and a thickness of 0.5 μm was formed by RF magnetron sputtering by the use of a mask. Next referring to FIG. 21D, on the first insulator film 81, the Cu film 75 having a width of 2 mm, a length of 20 mm, and a thickness of 1 μm was formed to extend in the longitudinal direction beyond the both ends of the first insulator film 81. Then, as ilustrated in FIG. 21E, the second insulator film 83 of $SiO_2$ having a width of 3 mm, a length of 16mm, and a thickness of 0.5 $\mu$m was formed to cover the center portion of the Cu film 75 and to overlap the first insulator film 81. Thereafter, as illustrated in FIG. 21F, the second soft magnetic thin film 85 of Co—Nb—Zr having a width of 4 mm, a length of 14 mm, and a thickness of 1 $\mu$m was formed to cover the second insualtor film 83. Thus, the magnetic sensor 97 was obtained. The magnetic sensor 97 experimentally manufactured had a dimension such that the Co—Nb—Zr film had a length of 14 mm and a width of 4 mm and that the Cu film (Cu electrode) had a length of 20 mm and a width of 2 mm. The magnetic sensor 97 was subjected to heat treatment at 400° C. for 2 hours in a vacuum of $5.0 \times 10^{-6}$ Torr or less and under a rotating magnetic field of H=500 Oe to relax magnetic anisotropy having been introduced during deposition of the films. Thereafter, heat treatment was carried out in a vacuum of the same degree and a static magnetic field of the same level to introduce uniaxial magnetic anisotropy in a widthwise direction of the magnetic sensor 97.

Figure 22:
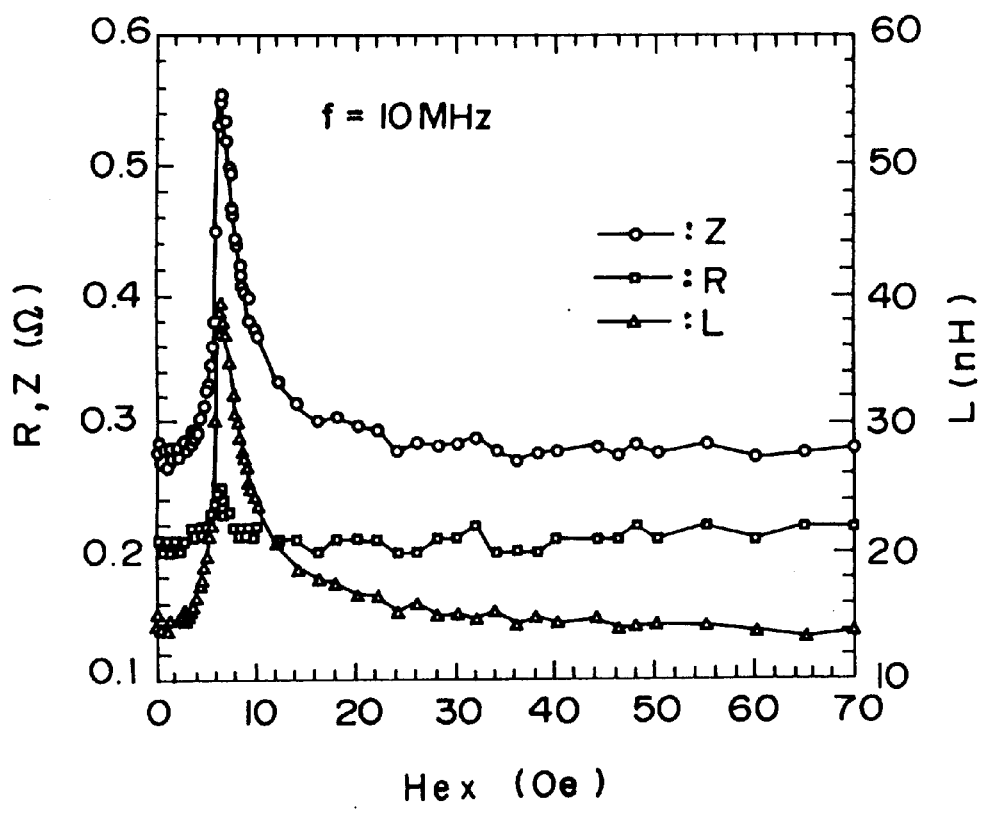
FIG. 22 shows the external magnetic field dependency of the impedance of the magnetic sensor of FIG. 18.

Then, with opposite ends of the Cu film 75 of the magnetic sensor 97 used as input terminals, an electric current of 10 MHz was supplied. In this state, the external magnetic field dependency of the impedance was measured. The impedance variation rate and the result of analysis of the composition by EPMA are shown in Table 1. For Sample 1 in Table 1, the external magnetic field dependency is plotted in FIG. 22. In Table 1, Samples 1 through 10 use the compositions of Co—Nb—Zr film of this invention while Samples 11 through 15 according to the ninth comparative example use other compositions different from this invention.

TABLE 1

| Sample No. | | Composition | | Impedance | Magnetic Field Sensitivity |
|---|---|---|---|---|---|
| | | Co (at %) | Nb (at %) | Zr (at %) | Variation Rate | sitivity (%/Oe) |
| Twelfth Embodiment | 1 | 84.3 | 12.6 | 3.1 | 107 %/6.5 Oe | 16.5 |
| | 2 | 83.8 | 13.5 | 2.8 | 103 %/6.2 Oe | 16.6 |
| | 3 | 83.2 | 13.5 | 3.3 | 100 %/6.0 Oe | 16.7 |
| | 4 | 86.5 | 10.5 | 3.0 | 130 %/8.2 Oe | 15.9 |
| | 5 | 80.3 | 13.6 | 6.1 | 95 %/5.9 Oe | 16.1 |
| | 6 | 84.1 | 13.9 | 2.0 | 115 %/7.5 Oe | 15.3 |
| | 7 | 85.5 | 12.2 | 2.3 | 126 %/8.2 Oe | 15.4 |
| | 8 | 84.5 | 13.7 | 1.8 | 145 %/8.8 Oe | 16.5 |
| | 9 | 83.2 | 11.5 | 5.3 | 109 %/6.6 Oe | 16.5 |
| | 10 | 82.2 | 16.3 | 1.5 | 99 %/6.2 Oe | 16.0 |
| Ninth Comparative Example | 11 | 88.6 | 10.9 | 0.5 | 143 %/18 Oe | 7.9 |
| | 12 | 84.2 | 9.0 | 6.8 | 135 %/15 Oe | 9.0 |
| | 13 | 80.2 | 18.5 | 1.3 | 56 %/8.9 Oe | 6.3 |
| | 14 | 79.2 | 15.6 | 5.2 | 80 %/8 Oe | 10.0 |
| | 15 | 87.2 | 9.2 | 3.8 | 138 %/16 Oe | 8.6 |

It is noted from Table 1, Samples 1–10 has a magnetic field sensitivity above 15%/Oe comparing with Comparative Examples 11–15.

Tenth Comparative Example

As a magnetic sensor of a tenth comparative example, a Co—Nb—Zr film having a thickness of 2 $\mu$m, a length of 4 mm, and a thickness of 4 mm was formed alone on the glass substrate 65 having a thickness of 1 mm in the twelfth embodiment. In the manner similar to the twelfth embodiment, the heat treatment was carried out within a magnetic field. The soft magnetic element was directly supplied with an electric current of 10 MHz. In this state, the external magnetic field dependency of the impedance was measured. As a result, the impedance variation rate was 30%/7 Oe and the magnetic field sensitivity was 4.3%/Oe. The film had a composition of 83.8 at % Co, 13.3 at % Nb, and 2.9 at % Zr. As compared with Sample 2 in the twelfth embodiment, the magnetic sensor of the twelfth embodiment (FIG. 20) having the core conductor 75 in addition to the soft magnetic layer 99 is obviously superior.

Eleventh Comparative Example

As an eleventh comparative example, a magnetic sensor was prepared which is similar to the magnetic sensor of the twelfth embodiment (FIGS. 18 through 20) except that the insulator layer 101 comprising the $SiO_2$ film is removed. Thus, the soft magnetic element comprises the glass substrate 65, the Cu film 75, and the Co—Nb—Zr film as the soft magnetic layer 99. In the manner similar to the twelfth embodiment, magnetic heat treatment was carried out. In the manner similar to the twelfth embodiment, the soft magnetic element is supplied with an electric current of 10 MHz. In this state, the external magnetic field dependency of the impedance was measured. As a result, the impedance variation rate was 50%/7 Oe and the magnetic field sensitivity was 6%/Oe. The Co—Nb—Zr film had a composition of 83.3 at % Co, 13.8 at % Nb, and 2.9 at % Zr. As compared with Sample 3 in the twelfth embodiment, the magnetic sensor of the twelfth embodiment (FIGS. 18 through 20) having the insulator layer between the soft magnetic layer and the conductor layer is obviously superior.

Twelfth Comparative Example

As a twelfth comparative example, a magnetic sensor similar to the magnetic sensor 97 of the twelfth embodiment (FIGS. 18 through 20) except that the soft magnetic layer 99 is formed by permalloy instead of Co—Nb—Zr was prepared. The magnetic sensor was evaluated for magnetic impedance characteristics. In the manner similar to the twelfth embodiment, an electric current of 10 MHz was supplied. In this state, the external magnetic field dependency of the impedance was measured. As a result, the impedance variation rate was 45%/9 Oe and the magnetic field sensitivity was 5%/Oe.

Thirteenth Embodiment

This embodiment is similar to the tenth embodiment of FIG. 15 but without the ground conductor film 35 as in the sixth comparative example.

Figure 23:
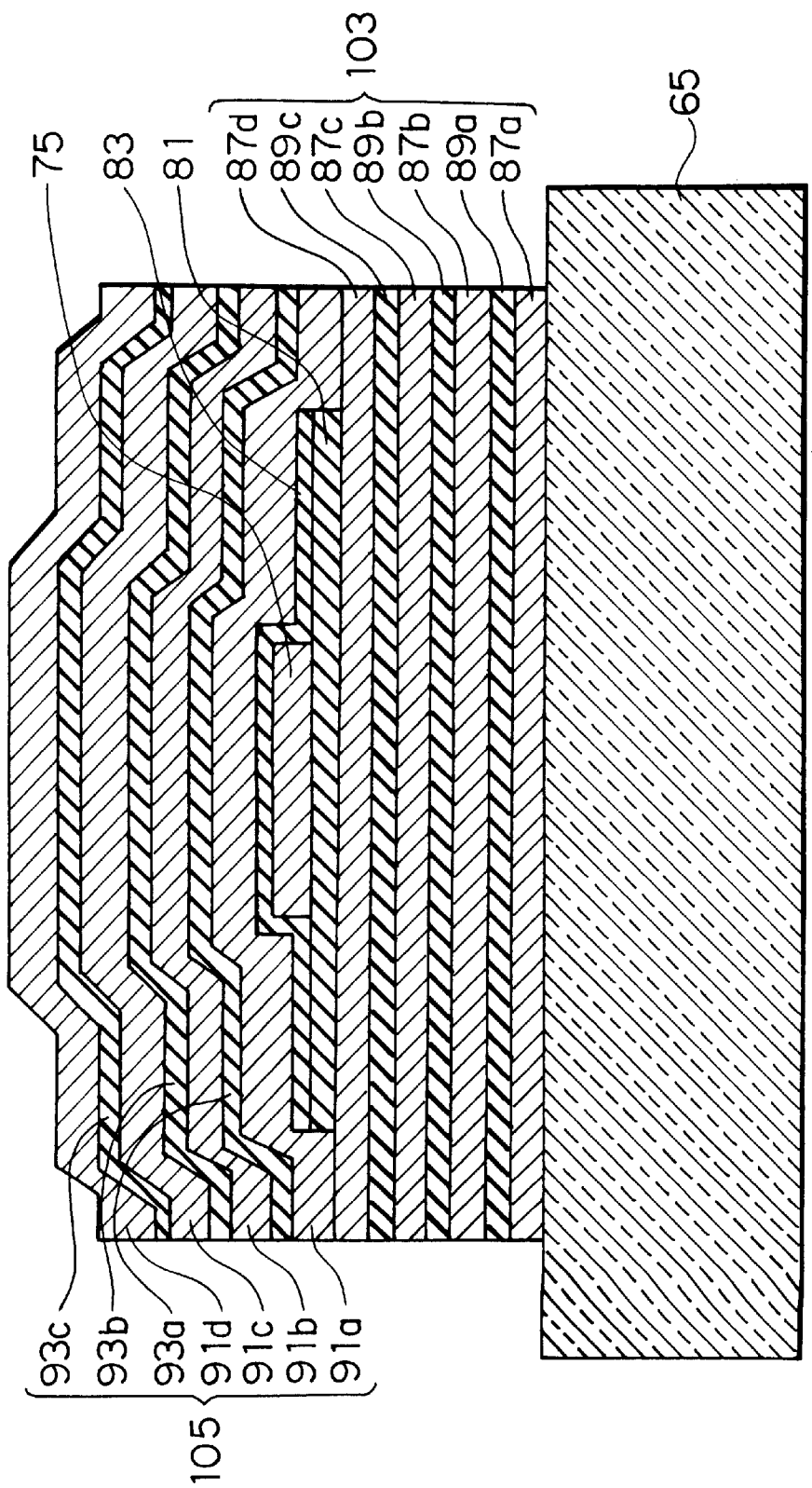
FIG. 23 is a sectional view of the magnetic sensor according to a thirteenth embodiment of this invention.

Referring to FIG. 23, a magnetic sensor 109 according to a thirteenth embodiment is similar to that of the twelfth embodiment (FIGS. 18 through 20) except that the first and the second soft magnetic thin films 79 and 85 each of which comprises a single layer of the Co—Nb—Zr film are replaced by first and second soft magnetic layers 103 and 107 each of which has a stacked structure.

As illustrated in FIG. 23, the first soft magnetic layer 103 comprises four soft magnetic thin films 87a through 87d of Co—Nb—Zr each having a thickness of 0.25 $\mu$m with three insulator films 89a through 89c each having a thickness of 0.1 $\mu$m interposed. Likewise, the second soft magnetic layer 107 comprises four soft magnetic thin films 91a through 91d of Co—Nb—Zr each having a thickness of 0.25 $\mu$m with three insulator films 93a through 93c each having a thickness of 0.1 $\mu$m interposed. A combination of the first and the second soft magnetic layers 103 and 107 forms the magnetic sensor or magnetic impedance element 109.

Figure 24:
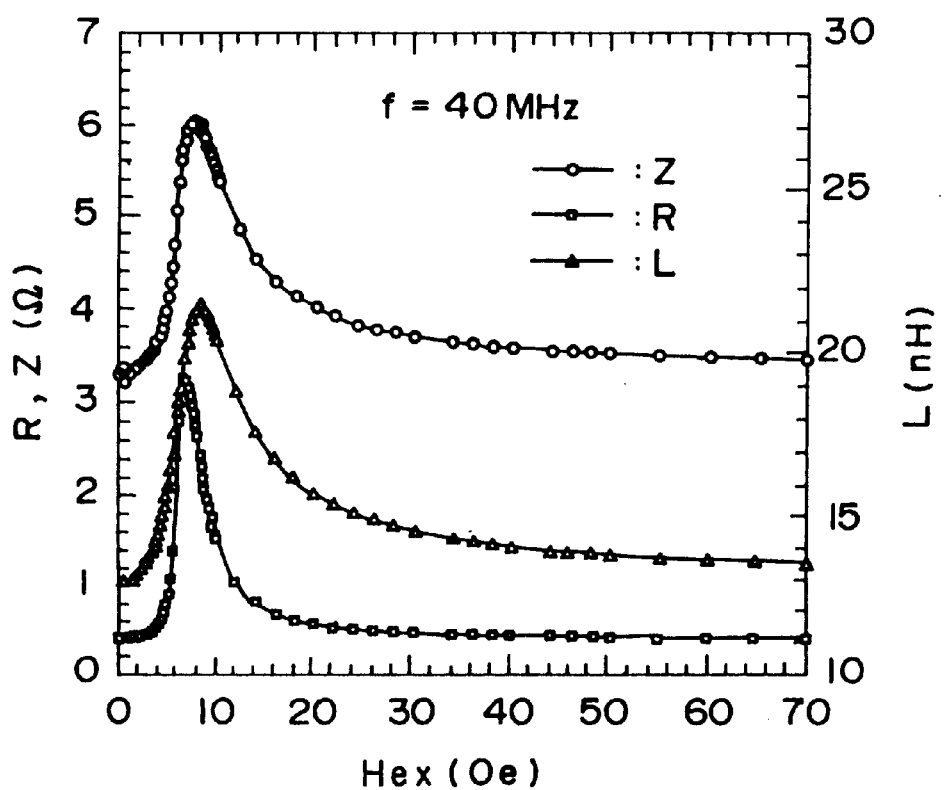
FIG. 24 shows the external magnetic field dependency of Z, L, and R of the magnetic sensor of FIG. 23.

In the manner similar to the twelfth embodiment, magnetic heat treatment was carried out. An electric current of 40 MHz was supplied to the Cu film 75. In this state, the external magnetic field dependency of each of an impedance, an inductance, and an resistance was measured. As a result, the impedance, the inductance, and the resistance exhibit the variation as illustrated in FIG. 24. In this case, the impedance variation rate was 12%/8 Oe and the magnetic field sensitivity was 15%/Oe. Each of the soft magnetic thin film had a composition of 84 at % Co, 12.8 at % Nb, and 3.2 at % Zr. As compared with a thirteenth comparative example which will be described in the following, this magnetic sensor is excellent in characteritics in a high frequency range.

Thirteenth Comparative Example

The magnetic sensor of Comparative Sample 11 in Table 1 was supplied with an electric current of 40 MHz, in the manner similar to the thirteenth embodiment. In this state, the external magnetic field dependency of the impedance was measured. As a result, the impedance variation rate was 80%/8 Oe and the magnetic field sensitivity was 10%/Oe.

Fourteenth Embodiment

A magnetic sensor according to a fourteenth embodiment is similar to the magnetic sensor 97 in the twelfth embodiment (FIGS. 18 through 20) except that $Si_3N_4$ films were used as the insulator layer 101 instead of $SiO_2$. In the manner similar to the twelfth embodiment, magnetic heat treatment was carried out. In the state where an electric current of 10 MHz was supplied, the impedance variation rate was measured at various strengths of the external magnetic field. As a result, the impedance variation rate was 110%/6.5 Oe and the magnetic field sensitivity was 16.9%/Oe.

Fifteenth Embodiment

A magnetic sensor according to a fifteenth embodiment is similar to the magnetic sensor 97 in the twelfth embodiment (FIGS. 18 through 29) except that $Al_2O_3$ films were used as the insulator layer 101 instead of $SiO_2$. In the manner similar to the twelfth embodiment, magnetic heat treatment was carried out. In the state where an electric current of 10 MHz was supplied, the impedance variation rate was measured at various strengths of the external magnetic field. As a result, the impedance variation rate was 113%/6.7 Oe and the magnetic field sensitivity was 16.9%/Oe.

Sixteenth Embodiment

A magnetic sensor according to a sixteenth embodiment is similar to the magnetic sensor 97 in the twelfth embodiment (FIGS. 18 through 20) except that the insulator layer 101 of $SiO_2$ is replaced by AlN films. In the manner similar to the twelfth embodiment, magnetic heat treatment was carried out. In the state where an electric current of 10 MHz was supplied, the impedance variation rate was measured at various strengths of the external magnetic field. As a result, the impedance variation rate was 103%/6.3 Oe and the magnetic field sensitivity was 16.3%/Oe.

As described above, according to each of the twelfth through the sixteenth embodiments of this invention, the magnetic thin film of Co—Nb—Zr amorphous metal including the conductor metal layer is used as the soft magnetic element in the magnetic sensor. With this structure, as compared with the conventional sensor which uses the magnetic metal layer or the magnetic metal wire also as the conductor metal, the d.c. electric resistance is reduced so that a higher sensitivity is achieved.

In addition, in each of the twelfth through the sixteenth embodiments of this invention, the glass ceramic insulator layer is interposed between the conductor metal layer and the Co—Nb—Zr amorphous metal magnetic thin film. Therefore, the d.c. current for application of the external magnetic field does not flow through the amorphous metal magnetic thin film. It is therefore possible to reduce the eddy current loss and to improve the magnetic characteristics in a high frequency band as compared with the structure having no insulator layer.

In the twelfth through the sixteenth embodiments of this invention, the Co—Nb—Zr layer does not have a single-layer structure but has a stacked structure with the glass ceramic layers interposed. It is therefore possible to cope with a still higher frequency band.

In the twelfth through the sixteenth embodiments of this invention, by selecting the appropriate composition of the amorphous Co—Nb—Zr magnetic metal layer, the magnetic sensor achieves the impedance variation rate greater than that obtained by the conventional sensors using the permalloy thin film or the Co—Si—B thin film.

What is claimed is:

1. A magnetic sensor for detecting a magnetic field strength, comprising:

an insulator substrate having first and second surfaces opposite to each other;

a soft magnetic element having first and second ends opposite to each other and mounted on said first surface of said insulator substrate; and a ground conductor mounted on said second surface of said insulator substrate;

wherein said ground conductor comprises a conductor film formed on said second surface of said insulator and is conductively coupled to said first end of said soft magnetic element, and wherein an impedance of said soft magnetic element between said first and said second ends thereof changes in dependence upon a magnetic field strength applied to said soft magnetic element.

2. A magnetic sensor for detecting a magnetic field strength, comprising:

an insulator substrate having first and second surfaces opposite to each other;

a soft magnetic wire having first and second ends opposite to each other and mounted on said first surface of said insulator substrate; and a ground conductor mounted on said second surface of said insulator substrate;

wherein a short circuiting conductor connects said first end of said soft magnetic wire with said ground conductor; and wherein an impedance of said soft magnetic wire between said first and said second ends thereof changes in dependence upon a magnetic field strength applied to said soft magnetic wire.

3. A magnetic sensor for detecting a magnetic field strength, comprising:

an insulator substrate having first and second surfaces opposite to each other;

a soft magnetic wire having first and second ends opposite to each other and mounted on said first surface of said insulator substrate; and a ground conductor mounted on said second surface of said insulator substrate;

wherein a short circuiting conductor connects said first end of said soft magnetic wire with said ground conductor;

wherein an impedance of said soft magnetic wire between said first and said second ends thereof changes in dependence upon a magnetic field strength applied to said soft magnetic wire; and wherein said soft magnetic wire comprises a coaxial soft magnetic wire having an outer soft magnetic portion and an inner conductor wire enclosed therein, said inner conductor wire being connected to said ground conductor.

4. A magnetic sensor as claimed in claim 3, wherein said soft magnetic element further comprises an insulator layer interposed between said outer soft magnetic portion and said internal conductor wire of said coaxial soft magnetic wire.

5. A magnetic sensor for detecting a magnetic field strength, comprising:

an insulator substrate having first and second surfaces opposite to each other;

a soft magnetic wire having first and second ends opposite to each other and mounted on said first surface of said insulator substrate; and a ground conductor mounted on said second surface of said insulator substrate;

wherein a short circuiting conductor connects said first end of said soft magnetic wire with said ground conductor;

wherein an impedance of said soft magnetic wire between said first and said second ends thereof changes in dependence upon a magnetic field strength applied to said soft magnetic wire; and wherein said ground conductor comprises a conductor wire attached to said second surface of said insulator substrate.

6. A magnetic sensor as claimed in claim 1, wherein said soft magnetic element comprises a soft magnetic thin film.

7. A magnetic sensor as claimed in claim 6, wherein said ground conductor comprises Cu, Ag, Au, Al, or an alloy containing at least one of Cu, Ag, Au, and Al.

8. A magnetic sensor for detecting a magnetic field strength, comprising:

an insulator substrate having first and second surfaces opposite to each other;

a soft magnetic element having first and second ends opposite to each other and mounted on said first surface of said insulator substrate; and a ground conductor mounted on said second surface of said insulator substrate;

wherein said ground conductor comprises a conductor film formed on said second surface of said insulator and is conductively coupled to said first end of said soft magnetic element;

wherein an impedance of said soft magnetic element between said first and said second ends thereof changes in dependence upon a magnetic field strength applied to said soft magnetic element; and wherein said soft magnetic element comprises an inner conductor layer extending in a longitudinal direction of said soft magnetic element, an insulator layer surrounding an outer periphery of said inner conductor layer, and a soft magnetic thin film covering said insulator layer, said inner conductor layer comprising Cu, Ag, Au, Al, or an alloy containing at least one of Cu, Ag, Au, and Al, and said insulator layer comprising at least one of $SiO_2$, $Si_3N_4$, and AlN.

9. A magnetic sensor for detecting a magnetic field strength, comprising:

an insulator substrate having first and second surfaces opposite to each other;

a soft magnetic element having first and second ends opposite to each other and mounted on said first surface of said insulator substrate; and a ground conductor mounted on said second surface of said insulator substrate;

wherein said ground conductor comprises a conductor film formed on said second surface of said insulator and is conductively coupled to said first end of said soft magnetic element;

wherein an impedance of said soft magnetic element between said first and said second ends thereof changes in dependence upon a magnetic field strength applied to said soft magnetic element; and wherein said soft magnetic element comprises an inner conductor layer and a stacked structure around said inner conductor layer, said stacked structure comprising a plurality of soft magnetic thin films stacked with insulator layers interposed therebetween, said inner conductor layer being made of at least one of Cu, Ag, Au, Al or alloys thereof, and each of said insulator layers being made of at least one of $SiO_2$, $Si_3N_4$, and AlN.

* * * * *